US012527026B2

(12) United States Patent
Sharma et al.

(10) Patent No.: US 12,527,026 B2
(45) Date of Patent: Jan. 13, 2026

(54) FIELD-EFFECT TRANSISTOR WITH HYBRID SWITCHING MECHANISM

(71) Applicant: Intel Corporation, Santa Clara, CA (US)

(72) Inventors: Abhishek A. Sharma, Hillsboro, OR (US); Anand S. Murthy, Portland, OR (US); Tahir Ghani, Portland, OR (US); Wilfred Gomes, Portland, OR (US); Pushkar Sharad Ranade, San Jose, CA (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 812 days.

(21) Appl. No.: 17/680,365

(22) Filed: Feb. 25, 2022

(65) Prior Publication Data

US 2023/0275151 A1 Aug. 31, 2023

(51) Int. Cl.
*H10D 30/62* (2025.01)
*H10D 30/01* (2025.01)
*H10D 84/01* (2025.01)
*H10D 84/03* (2025.01)

(52) U.S. Cl.
CPC .......... *H10D 30/62* (2025.01); *H10D 30/024* (2025.01); *H10D 84/0167* (2025.01); *H10D 84/038* (2025.01)

(58) Field of Classification Search
None
See application file for complete search history.

(56) References Cited

U.S. PATENT DOCUMENTS

2019/0363086 A1* 11/2019 Yang .................. H10D 84/0184

* cited by examiner

*Primary Examiner* — Steven B Gauthier
*Assistant Examiner* — Lamont B Koo
(74) *Attorney, Agent, or Firm* — Akona IP PC

(57) ABSTRACT

Hybrid FETs and methods of forming such hybrid FETs are disclosed. An example hybrid FET includes a channel region, a first region, a second region, a third region, and two gates. A gate may wrap around a portion of the channel region. The channel region may be over a first substrate (e.g., a substrate on which the channel region is formed) but cross a second substrate. The channel region is shared by a MOSFET and a TFET. The first region and second region constitute the source and drain of the MOSFET and are doped with dopants of the same type. The first region and third region constitute the source and drain of the TFET and are doped with dopants of opposite types. The third region may be placed at the opposite side of the second substrate from the first region and the second region.

19 Claims, 19 Drawing Sheets

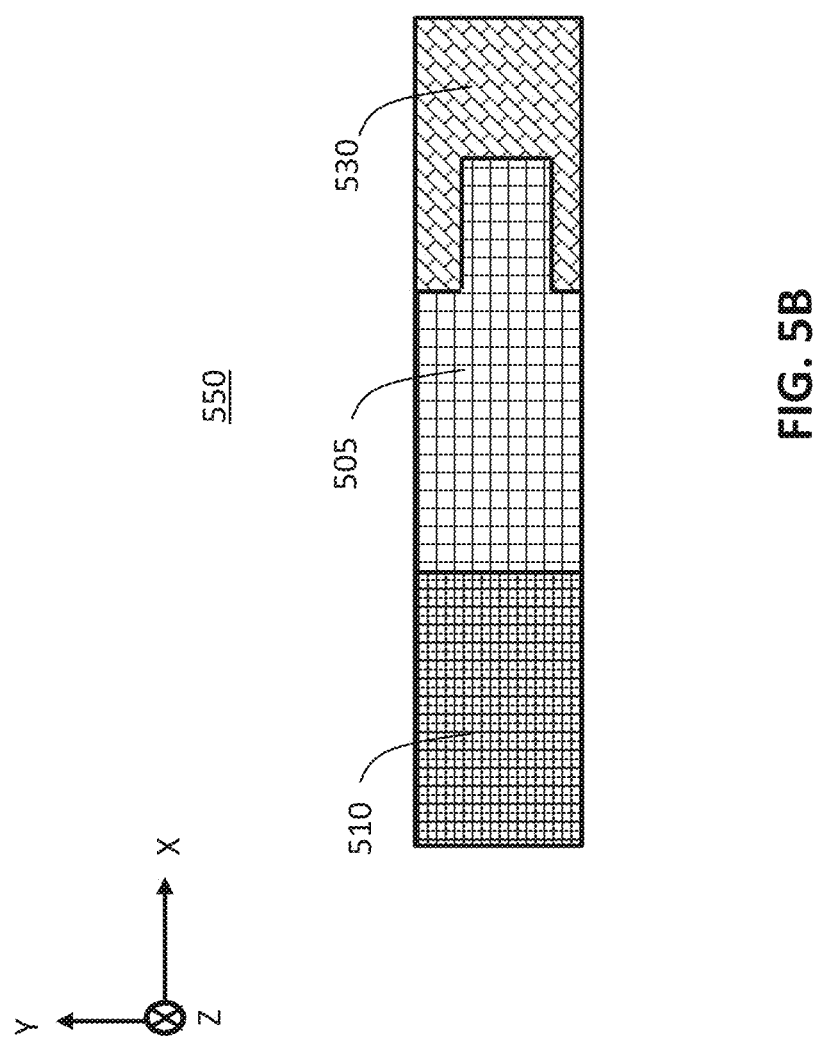

… (1)

FIELD-EFFECT TRANSISTOR WITH HYBRID SWITCHING MECHANISM

TECHNICAL FIELD

This disclosure relates generally to the field of semiconductor devices, and more specifically, to integrated circuit (IC) devices.

BACKGROUND

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more processing capacity, however, is not without issue. The necessity to optimize the performance and energy consumption of devices becomes increasingly significant. Tunneling field-effect transistors ("tunneling FETs," "tunnel FETs," or "TFETs") can be a booster for performance increase and energy consumption decrease.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5A and 5B illustrate semiconductor structures of a hybrid FET, according to some embodiments of the disclosure.

DETAILED DESCRIPTION

Overview

Figure 1:
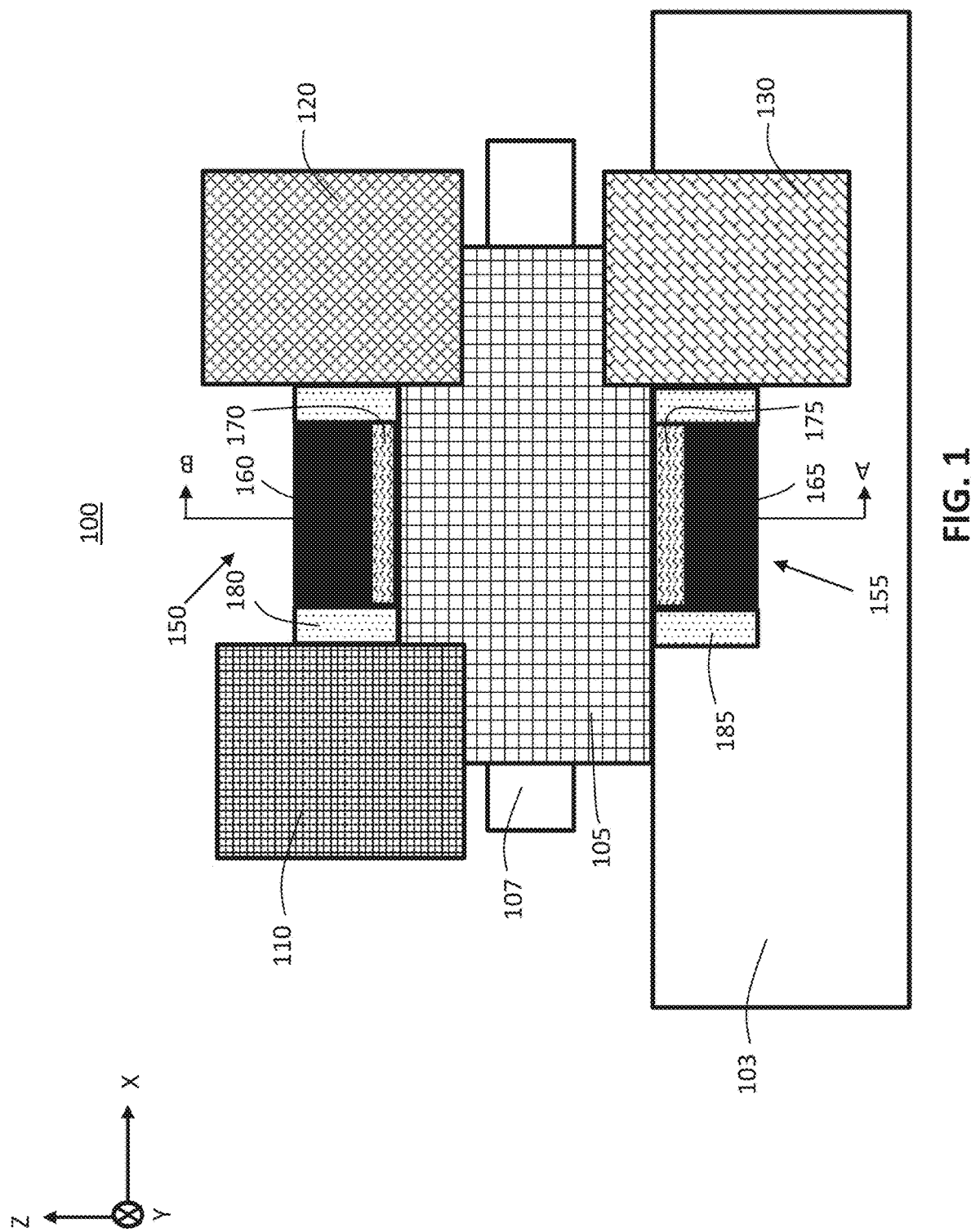
FIG. 1 is a cross-sectional view of an example IC device including a hybrid FET, according to some embodiments of the disclosure.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices with hybrid FETs, proposed herein, it might be useful to first understand phenomena that may come into play in such structures. The following foundational information may be viewed as a basis from which the present disclosure may be properly explained. Such information is offered for purposes of explanation only and, accordingly, should not be construed in any way to limit the broad scope of the present disclosure and its potential applications. Embodiments of the present disclosure are applicable to planar transistors, non-planar transistors (e.g., FinFETs, nanoribbon FETs, nanowire FETs, etc.), silicon-on-insulator transistors, gate-all-around transistors, or other types of transistors.

Metal-oxide-semiconductor FETs (MOSFETs) have been widely used in ICs. The superiority of MOSFETs lies in the scalability of these devices. However, the channel length scaling of MOSFETs has resulted in substantial energy dissipation in conventional complementary metal-oxide-semiconductor (CMOS) technology. As transistor size continues to decrease, the power supply voltage to transistors in ICs also decreases. The decrease in power supply voltage requires the threshold voltage of the transistors to decrease. However, lower threshold voltages can be difficult to obtain in MOSFETs because, as the threshold voltage is reduced, the ratio of ON-current to OFF-current also decreases. The ON-current refers to the current through a MOSFET when a gate voltage applied is above the threshold voltage and could be as high as the supply voltage, and the OFF-current refers to current through a MOSFET when no gate voltage is applied or when a gate voltage applied is below the threshold voltage. Also, as MOSFET gate length scaling continues, controlling short channel effects such as drain-induced barrier lowering (DIBL) and sub-threshold swing is imperative for improved performance. Transistors with reduced energy consumption are needed in order to continue realizing improved performance with scaling of MOSFETs.

TFETs have potential to reduce power consumption and energy dissipation. TFETs have different switching mechanism from MOSFETs, making TFET devices promising candidates for low-power electronics. In case of MOSFETs, carriers are injected thermionically over the barrier. However, in case of TFET, carriers are injected from source to channel due to gate field induced band-to-band tunneling (BTBT). In the OFF state, alignment between the conduction band of the channel and the valence band of the source is missing, which avoids carrier tunneling and maintains a very low leakage current. However, in the ON state, when the gate field is present, the channel region's conduction band is pulled down, which allows it to align with the source region's valence band. This alignment reduces the tunneling barrier width and height, which allows carrier tunneling from source to channel region. This enables a sharp turn-on when the bands are aligned, and therefore allows TFET devices to operate well below the sub-thermionic limits with sub-threshold swing values below 60 mV/decade. Under OFF state condition, TFET has comparatively higher barrier for the minority carriers, which leads to negligible leakage current due to minority carrier injection. Leakage current in TFET devices is well below leakage current in MOSFET devices at shorter channel lengths.

TFETs can have lower power consumption, compared with MOSFETs. However, MOSFETs outperform TFETs in terms of speed and energy efficiency, especially at higher drive voltages. Thus, improved technologies for FETs are needed.

Embodiments of the present disclosure relate to IC devices that include hybrid FETs, and to methods of forming such IC devices. A hybrid FET is a FET having a hybrid switching mechanism that combines the switching mechanism of a MOSFET and the switching mechanism of a TFET. An example hybrid FET includes a channel region that is shared by a MOSFET and a TFET. The hybrid FET also includes a first region, a second region, and a third region, each of which includes a doped semiconductor material. The channel region may cross a substrate, with a portion of the channel region may be above the substrate and another portion of the channel region may be below the substrate. The first region and the second region may be doped with the same type of dopants and constitute the source and drain of the MOSFET. The third region may be below the substrate. The first region and the third region may be doped with opposite types of dopants and constitute the source and drain of the TFET. The hybrid FET further includes a first gate and a second gate. The first gate is arranged between the first region and the second region and can be used to apply a gate voltage during operation of the MOSFET. The second gate is arranged between the first region and the third region and can be used to apply a gate voltage during operation of the TFET.

In some embodiments, the hybrid FET can be fabricated by providing the first region over a first section of the channel region, providing the second region over a second section of the channel region, and providing the third region over a third section of the channel region, where, as used herein, the term "section" refers to a part or portion. Also, the first gate can be provided over a fourth section of the channel region. The fourth section may be between the first section and the second section. The second gate can be provided over a fifth section of the channel region. The fifth section may be between the first section and the third section. A gate insulator can be provided for each gate electrode. The gate insulator separates the gate electrode from the channel regions. An additional gate insulator can also be formed for each gate electrode to separate the gate electrodes from the first region, the second region, and the third region.

The hybrid FET can operate in both low-voltage and high-voltage domains. The MOSFET and TFET in the hybrid FET may operate independently or together. The hybrid FET may operate based on BTBT, thermionic emission, or a combination of both. Thus, the hybrid FET may combine the advantages of both the MOSFET and TFET. The hybrid FET may not only be particularly suitable for low-power applications, but may also achieve speed and energy efficiency when high performance is required at higher drive voltages.

IC devices as described herein, in particular IC devices with including hybrid FETs as described herein, may be used for providing electrical connectivity to one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials, and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, such a collection may be referred to herein without the letters.

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Furthermore, although a certain number of a given element may be illustrated in some of the drawings (e.g., a certain number of TFETS, a certain number of source regions, a certain number of drain regions, a certain number of channel regions, a certain number of gate insulators, a certain number of gate electrodes, etc.), this is simply for ease of illustration, and more, or less, than that number may be included in an IC device with at least one hybrid FET as described herein. Still further, various views shown in some of the drawings are intended to show relative arrangements of various elements therein. In other embodiments, various IC devices with hybrid FETs as described herein, or portions thereof, may include other elements or components that are not illustrated (e.g., transistor portions, various components that may be in electrical contact with any of the transistors, etc.). Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of IC devices with hybrid FETs as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side" to explain various features of the drawings, but these terms are simply for ease of discussion, and do not imply a desired or required orientation. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art.

For example, some descriptions may refer to a particular source or drain region or contact being either a source region/contact or a drain region/contact. However, unless specified otherwise, which region/contact of a transistor is considered to be a source region/contact and which region/contact is considered to be a drain region/contact is not important because under certain operating conditions, designations of source and drain are often interchangeable. Therefore, descriptions provided herein may use the term of a "S/D" region/contact to indicate that the region/contact can be either a source region/contact, or a drain region/contact.

In another example, if used, the terms "package" and "IC package" are synonymous, as are the terms "die" and "IC die," the term "insulating" means "electrically insulating," the term "conducting" means "electrically conducting," unless otherwise specified. Although certain elements may be referred to in the singular herein, such elements may include multiple sub-elements. For example, "an electrically conductive material" may include one or more electrically conductive materials.

In another example, if used, the terms "oxide," "carbide," "nitride," etc. refer to compounds containing, respectively, oxygen, carbon, nitrogen, etc., the term "high-k dielectric" refers to a material having a higher dielectric constant than silicon oxide, while the term "low-k dielectric" refers to a material having a lower dielectric constant than silicon oxide.

In yet another example, a term "interconnect" may be used to describe any element formed of an electrically conductive material for providing electrical connectivity to one or more components associated with an IC or/and between various such components. In general, the "interconnect" may refer to both conductive lines/wires (also sometimes referred to as "lines" or "metal lines" or "trenches") and conductive vias (also sometimes referred to as "vias" or "metal vias"). In general, a term "conductive line" may be used to describe an electrically conductive element isolated by a dielectric material typically comprising an interlayer low-k dielectric that is provided within the plane of an IC chip. Such conductive lines are typically arranged in several levels, or several layers, of metallization stacks. On the other hand, the term "conductive via" may be used to describe an electrically conductive element that interconnects two or more conductive lines of different levels of a metallization stack. To that end, a via may be provided substantially perpendicularly to the plane of an IC chip or a support structure over which an IC device is provided and may interconnect two conductive lines in adjacent levels or two conductive lines in not adjacent levels. A term "metallization stack" may be used to refer to a stack of one or more interconnects for providing connectivity to different circuit components of an IC chip.

Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. The term "circuit" may be used to describe one or more passive and/or active components that are arranged to cooperate with one another to provide a desired function.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art. Also, the term "or" refers to an inclusive "or" and not to an exclusive "or."

Example IC Device Including Hybrid FET

FIG. 1 is a cross-sectional view 100 of an example IC device including a hybrid FET, according to some embodiments of the disclosure. FIG. 1 shows a coordination system, in which the IC device is placed. The coordination system includes an X-axis, a Y-axis, and a Z-axis. The cross-sectional view 100 of the IC device in FIG. 1 is a view of a cross-section of the IC device in the X-Z plane. The hybrid FET may be a combination of a MOSFET and a TFET sharing a common channel region 105. The hybrid FET may also include a first region 110, a second region 120, a third region 130, a first gate 150 and a second gate 155. The IC device may also include substrates 103 and 107, with which the hybrid FET is associated. In other embodiments, the IC device may include fewer, more, or different components.

The substrate 103 or 107 may be any suitable structure with which the hybrid FET (e.g., the channel region 105) can be associated. The channel region 105 may be over the substrate 103 and may cross the substrate 107. In some embodiments, the channel region 105 is arranged on a surface of the substrate 103. The channel region 105 may be formed over the substrate 103, e.g., on a surface of the substrate 103. The channel region 105 crosses the substrate 107. The channel region 105 may include a first portion above the substrate 107, a second portion in the substrate 107, and a third portion below the substrate 107. In other embodiments, the whole channel region 105 may be in the substrate 107. Alternatively, there is a portion of the channel region 105 at one side of the substrate 107 but no portion of the channel region 105 is at the opposite side of the substrate 107. As shown in FIG. 1A, the first region 110 and the second region 120 are above the substrate 107, and the third region 130 is below the substrate 107.

The substrate 103 or 107 may be a support structure, a die, a wafer, or a chip. In some embodiments, the substrate 103 or 107 may be a printed circuit board (PCB) substrate. In other embodiments, the substrate 103 or 107 is a semiconductor substrate, which is composed of semiconductor material systems including, for example, n-type or p-type materials systems. One or more transistors may be built on the substrate 103 or 107. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of Group III-V, Group II-VI, or Group IV materials. In some embodiments, the substrate may be non-crystalline.

Although a few examples of materials from which the substrate 103 or 107 may be formed are described here, any material that may serve as a foundation upon which IC devices implementing fill patterns as described herein may be built falls within the spirit and scope of the present disclosure. In various embodiments, the substrate 103 or 107 may include any such substrate material that provides a suitable surface for forming the fill pattern. The substrate 103 or 107 may, e.g., be the wafer 2000 of FIG. 11A, discussed below, and may be, or be included in, a die, e.g., the singulated die 2002 of FIG. 11B, discussed below.

The channel region 105 includes a channel material. The channel material may be composed of semiconductor material systems including, for example, n-type or p-type materials systems. In some embodiments, the channel material may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material may include a compound semiconductor with a first sub-lattice of at least one element from Group III of the periodic table (e.g., Al, Ga, In), and a second sub-lattice of at least one element of group V of the periodic table (e.g., P, As, Sb). In some embodiments, the channel material may include a compound semiconductor with a first sub-lattice of at least one element from Group II of the periodic table (e.g., Zn, Cd, Hg), and a second sub-lattice of at least one element of Group IV of the periodic table (e.g., C, Si, Ge, Sn, Pb). In some embodiments, the channel material is an epitaxial semiconductor material deposited using an epitaxial deposition process. The epitaxial semiconductor material may have a polycrystalline structure with a grain size between about 2 nanometers and 100 nanometers, including all values and ranges therein.

For some example n-type transistor embodiments (i.e., for the embodiments where the MOSFET is an n-type MOS (NMOS) transistor and the TFET is an n-type TFET), the channel material may advantageously include a III-V material having a high electron mobility, such as, but not limited to InGaAs, InP, InSb, and InAs. For some such embodiments, the channel material may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel material may be an intrinsic III-V material, i.e., a III-V semiconductor material not intentionally doped with any electrically active impurity. In alternate embodiments, a nominal impurity dopant level may be present within the channel material, for example to further fine-tune a threshold voltage Vt, or to provide HALO pocket implants, etc. Even for impurity-doped embodiments however, impurity dopant level within the channel material 304 may be relatively low, for example below $10^{15}$ dopant atoms per cubic centimeter ($cm^{-3}$), and advantageously below $10^{13}$ $cm^{-3}$. These materials may be amorphous or polycrystalline, e.g., having a crystal grain size between 0.5 nanometers and 100 nanometers.

For some example p-type transistor embodiments (i.e., for the embodiments where the MOSFET is a p-type MOS (PMOS) transistor and the TFET is a p-type TFET), the channel material may advantageously be a Group IV material having a high hole mobility, such as, but not limited to Ge or a Ge-rich SiGe alloy. For some example embodiments, the channel material may have a Ge content between 0.6 and 0.9, and advantageously may be at least 0.7. In some embodiments with highest mobility, the channel material may be intrinsic III-V (or IV for P-type devices) material and not intentionally doped with any electrically active impurity. In alternate embodiments, one or more a nominal impurity dopant level may be present within the channel material, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$. These materials may be amorphous or polycrystalline, e.g., having a crystal grain size between 0.5 nanometers and 100 nanometers.

In some embodiments, the channel material may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, aluminum zinc oxide, or tungsten oxide. In general, for a thin film transistor, the channel material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, molybdenum disulfide, N- or P-type amorphous or polycrystalline silicon, monocrystalline silicon, germanium, indium arsenide, indium gallium arsenide, indium selenide, indium antimonide, zinc antimonide, antimony selenide, silicon germanium, gallium nitride, aluminum gallium nitride, indium phosphite, black phosphorus, zinc sulfide, indium sulfide, gallium sulfide, each of which may possibly be doped with one or more of gallium, indium, aluminum, fluorine, boron, phosphorus, arsenic, nitrogen, tantalum, tungsten, and magnesium, etc. In some embodiments, a thin film channel material may be deposited at relatively low temperatures, which allows depositing the channel material within the thermal budgets imposed on back-end fabrication to avoid damaging other components, e.g., front end components such as logic devices.

As noted above, the channel material may include IGZO. IGZO-based devices have several desirable electrical and manufacturing properties. IGZO has high electron mobility compared to other semiconductors, e.g., in the range of 20-50 times than amorphous silicon. Furthermore, amorphous IGZO (a-IGZO) transistors are typically characterized by high band gaps, low-temperature process compatibility, and low fabrication cost relative to other semiconductors.

IGZO can be deposited as a uniform amorphous phase while retaining higher carrier mobility than oxide semiconductors such as zinc oxide. Different formulations of IGZO include different ratios of indium oxide, gallium oxide, and zinc oxide. One particular form of IGZO has the chemical formula $InGaO_3(ZnO)_5$. Another example form of IGZO has an indium:gallium:zinc ratio of 1:2:1. In various other examples, IGZO may have a gallium to indium ratio of 1:1, a gallium to indium ratio greater than 1 (e.g., 2:1, 3:1, 4:1, 5:1, 6:1, 7:1, 8:1, 9:1, or 10:1), and/or a gallium to indium ratio less than 1 (e.g., 1:2, 1:3, 1:4, 1:5, 1:6, 1:7, 1:8, 1:9, or 1:10). IGZO can also contain tertiary dopants such as aluminum or nitrogen.

The first region 110, second region 120, and third region 130 are coupled to the channel region 105. In some embodiments, the first region 110 and the second region 120 are at an opposite side of the channel region 105 from the third region 130. For instance, the first region 110 and the second region 120 is over (e.g., contacts) a top surface of the channel region 105, versus the third region 130 is over (e.g., contacts) a bottom surface of the channel region 105. The bottom surface is opposite the top surface. In other embodiments, at least a portion of one of the three regions may be in the substrate 107. Each of the first region 110, second region 120, and third region 130 includes a semiconductor material, which may be the same as the channel material. In some embodiments, the semiconductor material of the first region is the same as the semiconductor material of third region 130 but different from the semiconductor material of the second region 120.

A semiconductor material of a region may be a Group IV material, a compound of Group IV materials, a Group III/V material, a compound of Group III/V materials, a Group II/VI material, a compound of Group II/VI materials, or other semiconductor materials. Example Group II materials include zinc (Zn), cadmium (Cd), and so on. Example Group III materials include aluminum (Al), boron (B), indium (In), gallium (Ga), and so on. Example Group IV materials include silicon (Si), germanium (Ge), carbon (C), etc. Example Group V materials include nitrogen (N), phosphorus (P), arsenic (As), antimony (Sb), and so on. Example Group VI materials include sulfur (S), selenium (Se), tellurium (Te), oxygen (O), and so on. A compound of Group IV materials can be a binary compound, such as SiC, SiGe, and so on. A compound of Group III/V materials can be a binary, tertiary, or quaternary compound, such as GaN, InN, and so on. A compound of Group II/VI materials can be a binary, tertiary, or quaternary compounds, such as CdSe, CdS, CdTe, ZnO, ZnSe, ZnS, ZnTe, CdZnTe, CZT, HgCdTe, HgZnTe, and so on.

The first region 110 and the second region 120 constitute a pair of a source region and a drain region of the MOSFET. In an embodiment, the first region 110 is the source region and the second region 120 is the drain region. In another embodiment, the first region 110 is the drain region and the second region 120 is the source region. The first region 110 and the second region 120 are doped with the same type of dopants. In some embodiments (e.g., embodiments where the MOSFET is a PMOS transistor), the first region 110 and the second region 120 are doped with p-type dopants. In other embodiments (e.g., embodiments where the MOSFET is a NMOS transistor), the first region 110 and the second region 120 are doped with n-type dopants. Example n-type dopants include Te, S, As, tin (Sn), Si, Ga, Se, S, In, Al, Cd, chlorine (Cl), iodine (I), fluorine (F), and so on. Example p-type dopants include beryllium (Be), Zn, magnesium (Mg), Sn, P, Te, lithium (Li), sodium (Na), Ga, Cd, and so on.

The gate 150 functions as a gate of the MOSFET. The gate 150 includes a gate electrode 160 and gate insulators 170 and 180. The gate insulator 170 separates at least a portion of the channel region 105 from the gate electrode 160. The gate insulator 180 separates at least a portion of the first region 110 and at least a portion of the second region 120 from the gate electrode 160. In some embodiments, the gate insulator 180 is one integrated piece that continuously wraps around the gate electrode 160. The gate insulator 180 may also wrap around the gate insulator 170. In other embodiments, the gate insulator 180 include separate pieces: one piece separates the first region 110 from the gate electrode 160 and another piece separates the second region 120 from the gate electrode 160. A gate insulator includes an electrical insulator, such as a dielectric material, hysteretic material, and so on. Example dielectric material includes oxide (e.g., Si based oxides, metal oxides, etc), high-k dielectric (i.e., a material with a higher dielectric contact than $SiO_2$), and so on. Example hysteretic material include ferroelectric materials, antiferroelectric materials, etc.

The gate electrode 160 includes a conductor. The gate electrode 160 can be coupled to a gate terminal to facilitate application of a gate voltage on a portion of the channel region 105. In some embodiments, the gate electrode 160 is a planar electrode over the portion of the channel region 105 so that the MOSFET is a planar transistor. In other embodiments, the gate electrode 160 wraps around the portion of the channel region 105 so that the MOSFET is a non-planar transistor. The channel region 105 may be a semiconductor structure having a shape of fin, nanoribbon, nanowire, etc. The gate electrode 160 is over the gate insulator 170. In some embodiments, the gate electrode 160 is provided upon the gate insulator 170 such that the gate electrode 160 does not extend beyond the gate insulator 170 in the direction along the X-axis. The gate electrode 160 includes an electrical conductor, such as a metal, alloy, metal-nitride, conductive oxide, conductive metal compounds, and so on. A thickness of the gate electrode 160 or the gate insulator 170 along the Z-axis may be in a range from 0.5 nm to 20 nm.

The first region 110 and the third region 130 constitute a pair of a source region and a drain region of the TFET. In an embodiment, the first region 110 is the source region and the third region 130 is the drain region. In another embodiment, the first region 110 is the drain region and the third region 130 is the source region. The first region 110 and the third region 130 are doped with opposite types of dopants. In an example, the first region 110 is doped with n-type dopants and the third region 130 is doped with p-type dopants. In another example, the first region 110 is doped with p-type dopants and the third region 130 is doped with n-type dopants.

In some embodiments, the S/D regions (i.e., the first region 110, the second region 120, and the third region 130) may be highly doped, e.g., with dopant concentrations of about 1.1021 dopants per cubic centimeter ($cm^{-3}$), in order to advantageously form Ohmic contacts with the respective S/D contacts (also sometimes interchangeably referred to as "S/D electrodes"), although these regions may also have lower dopant concentrations and may form Schottky contacts in some implementations. Irrespective of the exact doping levels, the S/D regions may be the regions having dopant concentration higher than in other regions, e.g., higher than a dopant concentration in the channel region 105, and, therefore, may be referred to as "highly doped" (HD) regions. The channel region 105 may include one or more semiconductor materials with doping concentrations significantly smaller than those of the S/D regions. For example, in some embodiments, the channel material of the channel region 105 may be an intrinsic (e.g., undoped) semiconductor material or alloy, not intentionally doped with any electrically active impurity. In alternate embodiments, nominal impurity dopant levels may be present within the channel material, for example to set a threshold voltage Vt, or to provide HALO pocket implants, etc. In such impurity-doped embodiments however, impurity dopant level within the channel material are still significantly lower than the dopant level in the S/D regions, for example below $10^{15}$ $cm^{-3}$, or below $10^{13}$ $cm^{-3}$. Depending on the context, the term "S/D terminal" may refer to a S/D region or a S/D contact or electrode of a transistor.

The gate 155 functions as a gate of the TFET. In the embodiment of FIG. 1, the gate 155 is below the substrate 107. In other embodiments, the gate 155 may be above the substrate 107. The gate 155 includes a gate electrode 165 and gate insulators 175 and 185. The gate insulator 175 separates at least a portion of the channel region 105 from the gate electrode 165. The gate insulator 185 separates at least a portion of the first region 110 and at least a portion of the second region 120 from the gate electrode 165. In some embodiments, the gate insulator 185 is one integrated piece that continuously wraps around the gate electrode 165. The gate insulator 185 may also wrap around the gate insulator 175. In other embodiments, the gate insulator 185 include separate pieces: one piece separates the first region 110 from the gate electrode 165 and another piece separates the second region 120 from the gate electrode 165. A gate insulator includes an electrical insulator, such as a dielectric material, hysteretic material, and so on. Example dielectric material includes oxide (e.g., Si based oxides, metal oxides, etc), high-k dielectric (i.e., a material with a higher dielectric contact than $SiO_2$), and so on. Example hysteretic material include ferroelectric materials, antiferroelectric materials, etc.

The gate electrode 165 includes a conductor. The gate electrode 165 can be coupled to a gate terminal to facilitate application of a gate voltage on a portion of the channel region 105. In some embodiments, the gate electrode 165 is a planar electrode over the portion of the channel region 105 so that the TFET is a planar transistor. In other embodiments, the gate electrode 165 wraps around the portion of the channel region 105 so that the TFET is a non-planar transistor. The gate electrode 165 is over the gate insulator 175. In some embodiments, the gate electrode 165 is provided upon the gate insulator 175 such that the gate electrode 165 does not extend beyond the gate insulator 175 in the direction along the X-axis. The gate electrode 165 includes an electrical conductor, such as a metal, alloy, metal-nitride, conductive oxide, conductive metal compounds, and so on. A thickness of the gate electrode 165 or the gate insulator 175 along the Z-axis may be in a range from 0.5 nm to 20 nm.

In some embodiments, the gate electrode 165 is insulated from the gate electrode 160 so that the MOSFET and TFET can operate separately. For instance, different gate voltages can be applied through the gate electrodes 160 and 165 to turn on the MOSFET and TFET separately. The gate electrode 165 can be separated from the gate electrode 160 by one or more insulators. In other embodiments, the gate electrode 165 is electrically coupled to the gate electrode 160. For instance, the gate electrode 165 is connected to the gate electrode 160 through a conductor, e.g., a wire. The gate electrodes 160 and 165 are at the same voltage, under which the MOSFET and TFET may operate.

In some embodiments, the hybrid FET (or a portion of the hybrid FET, e.g., the MOSFET or TFET) may be a thin-film transistor (TFT). A TFT is a special kind of a FET made by depositing a thin film of an active semiconductor material, as well as a dielectric layer and conductive (e.g., metallic) contacts, over a supporting layer that may be a non-conductor layer and a non-semiconductor layer. At least a portion of the active semiconductor material forms a channel region/material of the TFT. This is different from conventional, non-TFT, front-end-of line (FEOL) transistors where the semiconductor channel material of a transistor is typically a part of a semiconductor substrate, e.g., a part of a silicon wafer, or is epitaxially grown on a semiconductor substrate. Using TFTs as transistors of memory cells provides several advantages and enables unique architectures that were not possible with conventional, FEOL logic transistors. For example, advantages include substantially lower leakage in TFTs than in logic transistors and lower temperature processing used to fabricate TFTs. In context of the present disclosure, the hybrid FET being a TFT advantageously allows depositing a thin-film channel material of the hybrid FET in a non-planar arrangement to realize vertical transistor architecture, as will be described in greater detail below.

The MOSFET and TFET can operate independently or simultaneously. The MOSFET may have a sub-threshold swing (SS) above 60 mv/dec. In other words, the MOSFET requires more than 60 my of gate voltage swing to induce a variation of one order of magnitude in current. The TFET may have an SS below 60 mv/dec. In an embodiment, the minimum SS of the MOSFET is approximately 62 mv/dec and the minimum SS of the TFET is approximately 42 my/dec. As the hybrid FET has a hybrid switching mechanism, it can operate under both MOSFET operation modes and TFET operation modes. Thus, the hybrid FET can be used in both high-voltage domains and low-voltage applications.

In some embodiments (e.g., embodiments the gate electrodes 160 and 165 are insulated from each other), the hybrid FET can function as a MOSFET when a gate voltage is applied on the gate electrode 160. The hybrid FET is a high-voltage device and operates based on thermionic emission over the source/drain barrier, but no tunneling occurs or is involved in the operation. When a gate voltage is applied on the gate electrode 165, the hybrid FET can function as a TFET. The hybrid FET is a low-voltage device and operates based on tunneling through the source/region barrier. In other embodiments (e.g., embodiments the gate electrodes 160 and 165 are electrically coupled), the hybrid FET operates like a TFET under the threshold voltage of the MOSFET and operations like a MOSFET above the threshold voltage of the MOSFET. The MOSFET or TFET may be a planar transistor, a non-planar transistor (e.g., FinFET, nanoribbon FET, nanowire FET, etc.), silicon-on-insulator transistor, gate-all-around transistor, or other types of transistors.

In the embodiment of FIG. 1, the cross-sections of the channel region 105, first region 110, second region 120, and third region 130 in the X-Z plane are rectangular. In other embodiments, the first region 110, channel region 105, and second region 120 can have different shapes. For instance, the cross-section of the channel region 105, first region 110, second region 120, or third region 130 in the X-Z plane can have a shape of a circle, square, triangle, trapezoid, oval, parallelogram, and so on. Also, the shapes of the gate electrodes 160 and 165 and the gate insulators 170, 175, 180, and 185 can be different from the shapes shown in FIG. 1.

Figure 2:
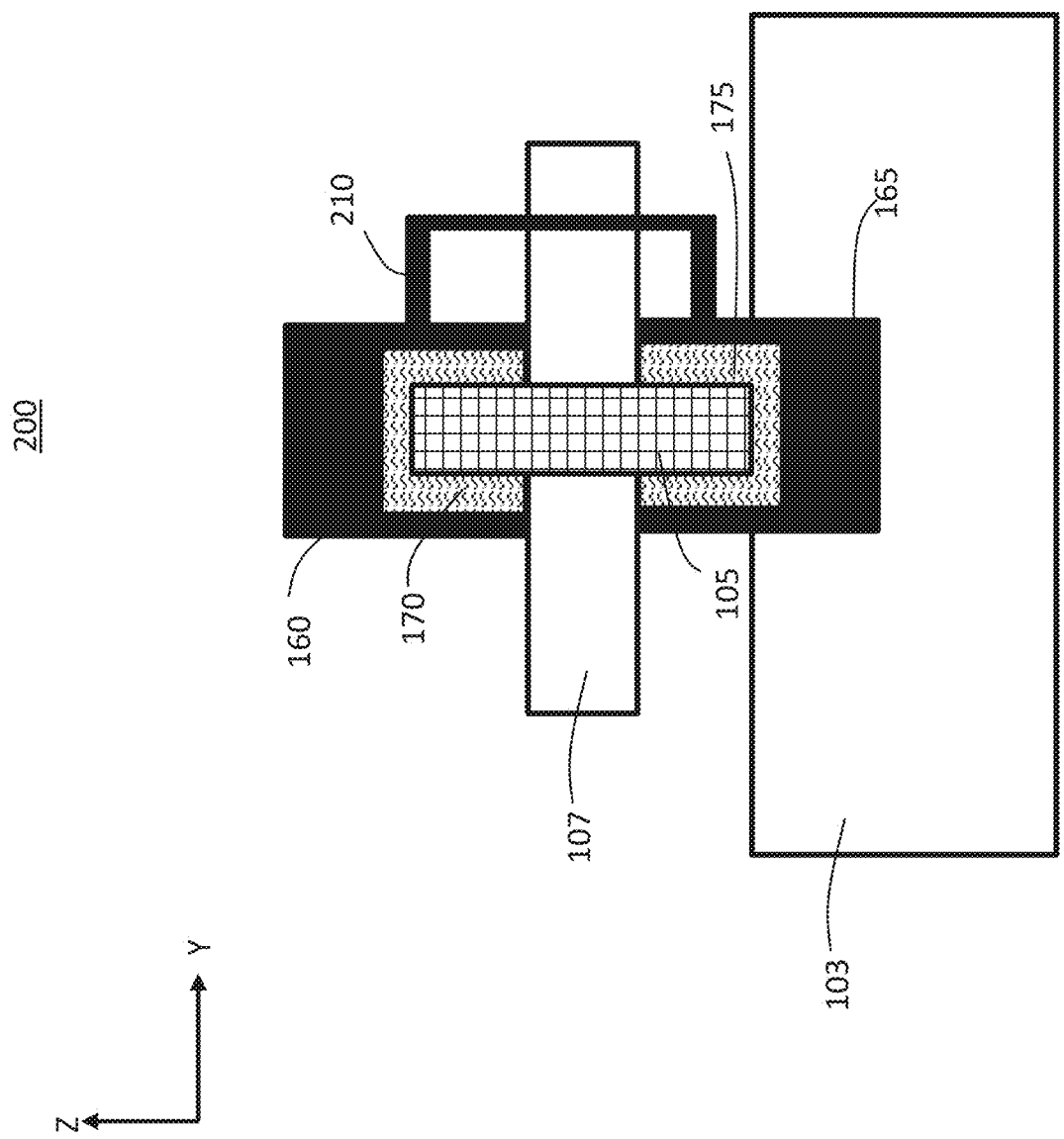
FIG. 2 is another cross-sectional view of the IC device in FIG. 1, according to some embodiments of the disclosure.

FIG. 2 is another cross-sectional view 200 of the IC device in FIG. 1, according to some embodiments of the disclosure. The cross-sectional view 200 of the IC device is the view of the cross-section A-B. In the embodiment of FIG. 2, the hybrid FET is a non-planar transistor. The gate insulator 170 wraps around the channel region 105 and the gate electrode 160 wraps around the gate insulator 170. As shown in FIG. 2, the gate insulator 170 is placed on three sides of the channel region 105 and the gate electrode 160 is placed on three sides of the gate insulator 170. Similarly, the gate insulator 175 wraps around the channel region 105 and the gate electrode 165 wraps around the gate insulator 175. In other embodiments, the hybrid FET may be a planar transistor. For instance, the gate electrode 160 or 165 is over one single side of the channel region 105.

The gate electrode 160 and gate insulator 170 are at an opposite side of the substrate 107 from the gate electrode 165 and gate insulator 175. As shown in FIG. 2, the gate electrode 160 and gate insulator 170 are above the substrate 107, versus the gate electrode 165 and gate insulator 175 are below the substrate 107. In other embodiments, the gate electrodes 160 and 165 and gate insulators 170 and 175 may be at the same side of the substrate 107, e.g., above the substrate 107.

In the embodiment of FIG. 2, the gate electrode 160 is electrically coupled to the gate electrode 165 through a conductor 210. The conductor 210 constitutes an electrically conductive path between the gate electrodes 160 and 165. In some other embodiments, the gate electrodes 160 and 165 are connected to a different electrically conductive path. The electrically conductive path may be at least partially in or over the substrate 107. The electrically conductive path may include one or more vias or wires. In some other embodiments, the gate electrodes 160 and 165 are insulated from each other. The hybrid FET does not include the conductor 210. Rather, the gate electrodes 160 and 165 are separated from each other by one or more insulators. An insulator may be at least partially in or over the substrate 107.

Figure 3:
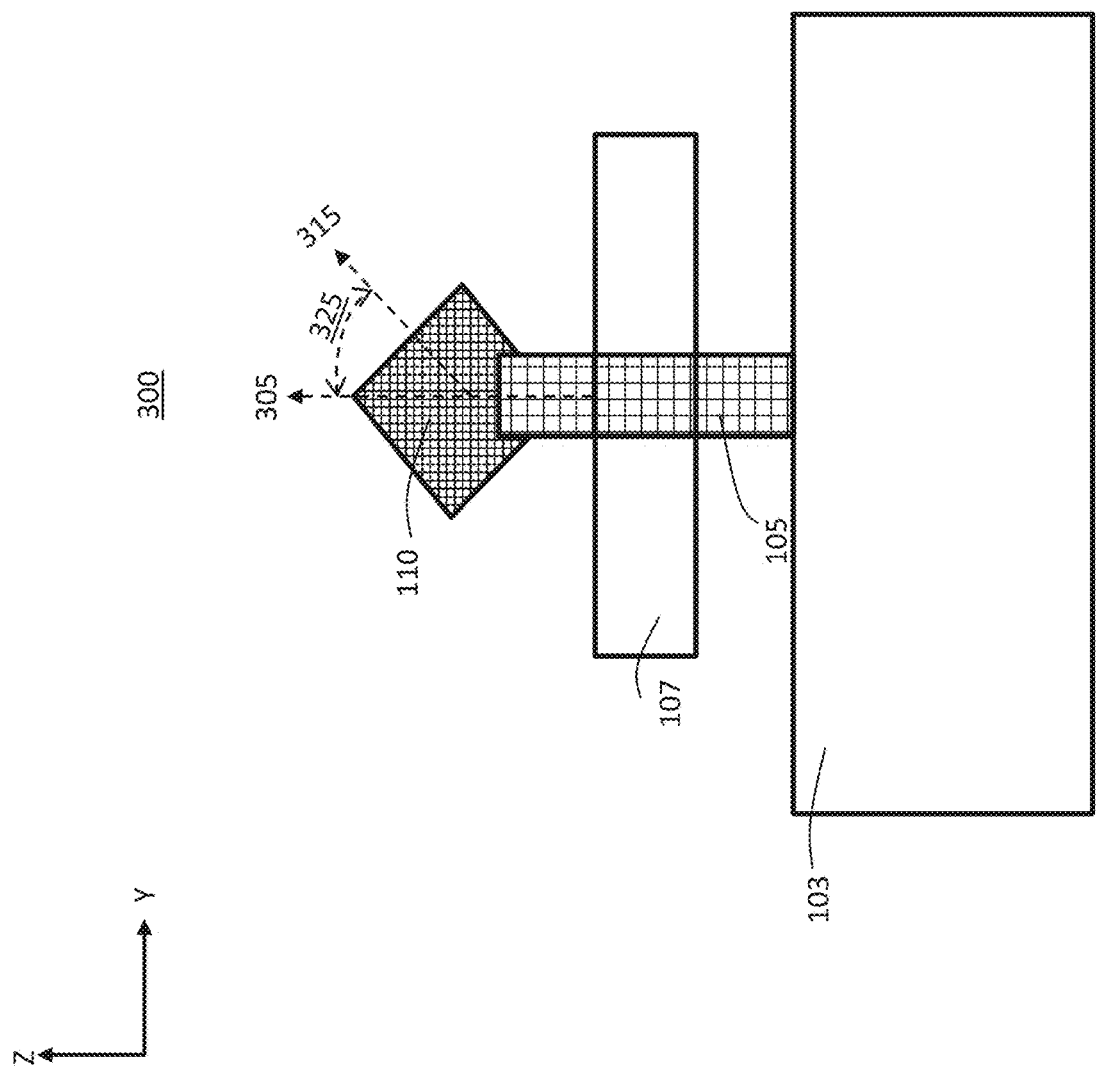
FIG. 3 is an example left-side view of the IC device in FIG. 1, according to some embodiments of the disclosure.

FIG. 3 is an example left-side view 300 of the IC device in FIG. 1, according to some embodiments of the disclosure. The left-side view 300 includes the channel region 105, substrate 107, and first region 110 in the Y-Z plane. As shown in FIG. 3, the first region 110 wraps around a portion of the channel region 105. In the embodiment of FIG. 3, the channel region 105 and the second region 340 are crystalline layers, each of which has a crystal orientation. The channel region 105 has a crystal orientation 305 along the Z-axis. The first region 110 has a crystal orientation 315 that is at an angle 325 to the crystal orientation 305, i.e., the crystal orientation 315 is not aligned with the crystal orientation 305. For purpose of illustration, the cross-section of the first region 110 in FIG. 3 has a shape of a parallelogram with sharp corners. In other embodiments, the cross-section of the second region 340 can have other shapes, e.g., a curved shape with round corners. The first region 110 can be formed over the channel region 105 through an epitaxy process or a layer transfer process. More details regarding formation of the first region 110 is described below in conjunction with FIGS. 6A-6H, FIGS. 7A and 7B, and FIGS. 8A and 8B.

Figure 4:
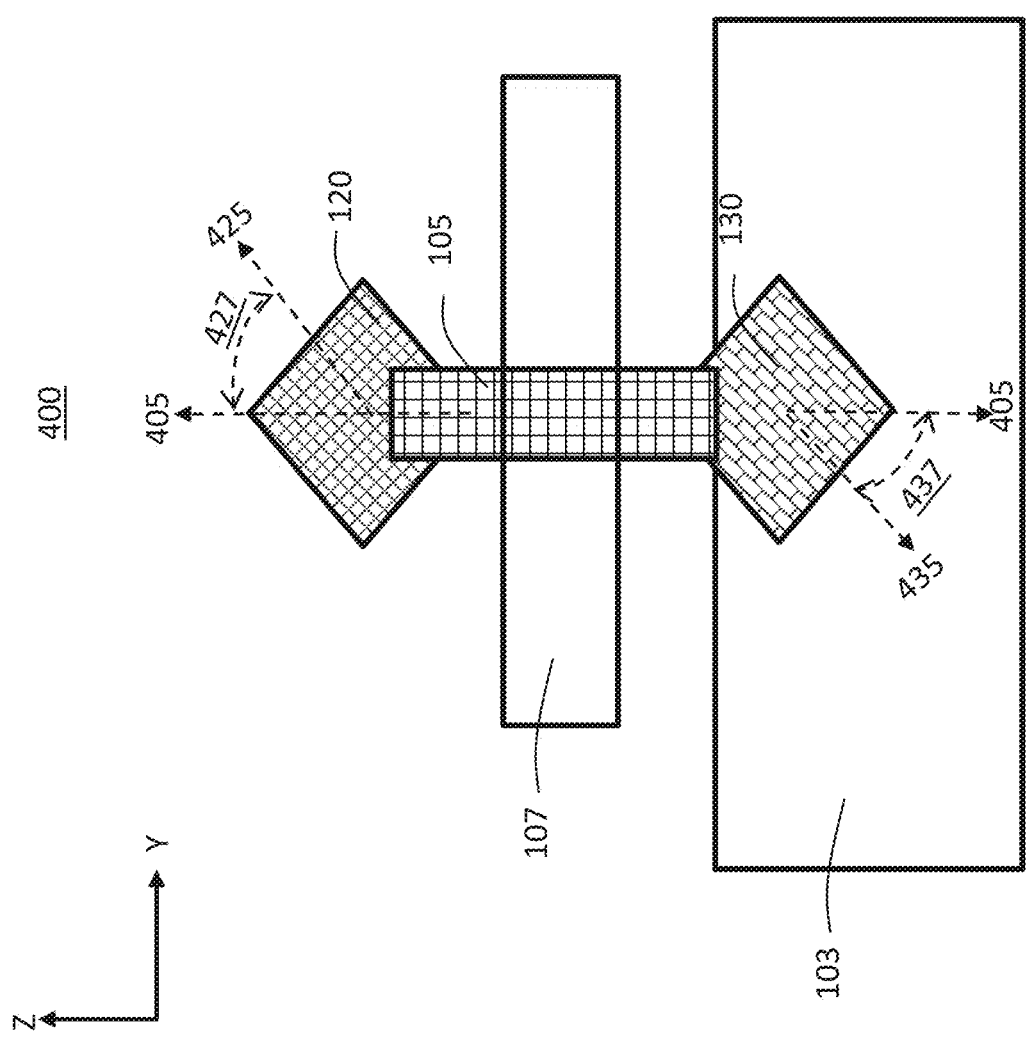
FIG. 4 is an example right-side view of the IC device in FIG. 1, according to some embodiments of the disclosure.

FIG. 4 is an example right-side view 400 of the IC device in FIG. 1, according to some embodiments of the disclosure. The right-side view 400 includes the channel region 105, substrate 107, second region 120, and third region 130 in the Y-Z plane. As shown in FIG. 4, the second region 120 wraps around a portion of the channel region 105 above the substrate 107. The third region 130 wraps around a portion of the channel region 105 above the substrate 107. In the embodiment of FIG. 2, the channel region 105, second region 120, and third region 130 are crystalline layers, each of which has a crystal orientation. The channel region 405 has a crystal orientation 205 along the Z-axis. The second region 120 has a crystal orientation 425 that is at an angle 427 to the crystal orientation 405, i.e., the crystal orientation 425 is not aligned with the crystal orientation 405. The third region 130 has a crystal orientation 435 that is at an angle 437 to the crystal orientation 405, i.e., the crystal orientation 435 is not aligned with the crystal orientation 405.

For purpose of illustration, the cross-sections of the channel region 105, second region 120, and third region 130 in FIG. 4 have shapes of parallelograms with sharp corners. In other embodiments, the cross-section of the second region 120 or the third region 130 can have other shapes, e.g., a curved shape with round corners. In some embodiments, the second region 120 and third region 130 are formed over the channel region 105 through a layer transfer process or an epitaxy process.

Figure 5A:
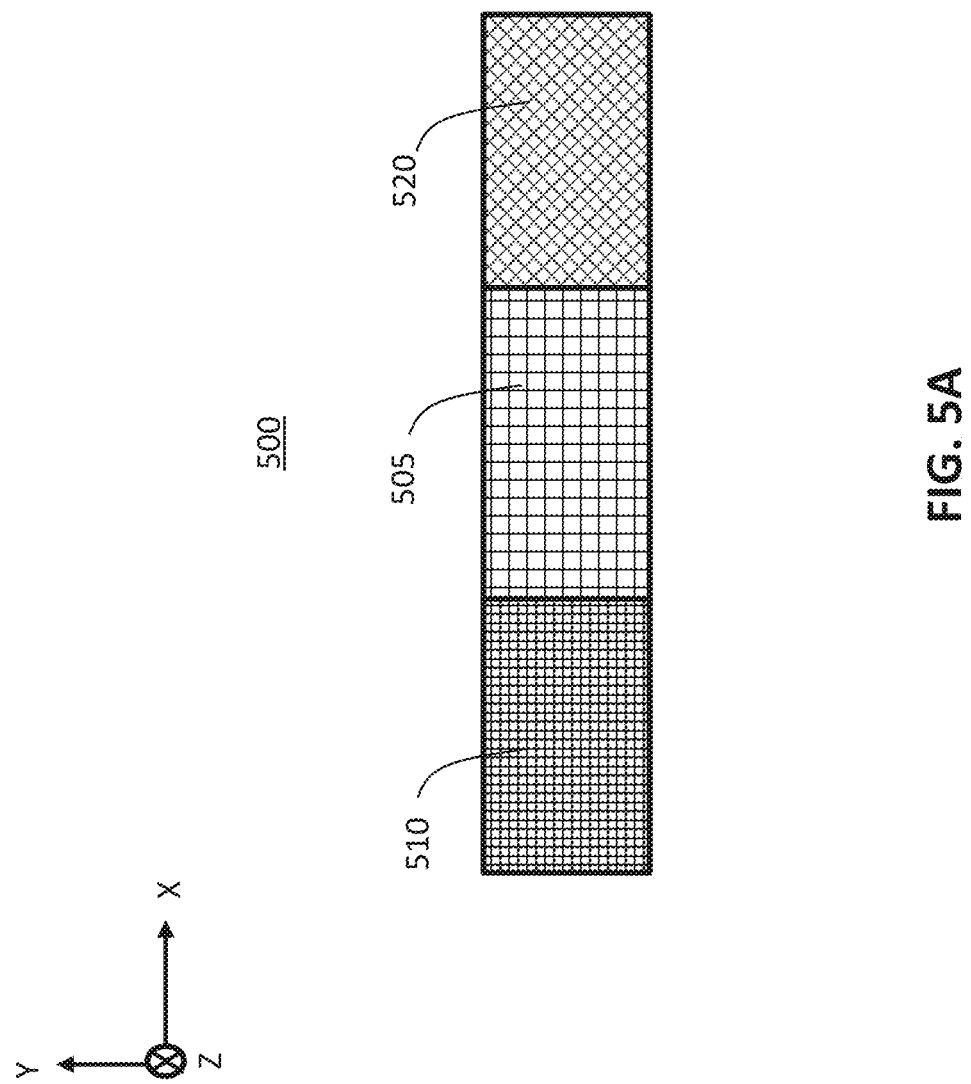

FIGS. 5A and 5B illustrate semiconductor structures 500 and 550 of a hybrid FET, according to some embodiments of the disclosure. The hybrid FET may be an embodiment of the hybrid FET described above in conjunction with FIG. 1. As shown in FIG. 5A, the semiconductor structure 500 includes A channel region 505, a first region 510, and a second region 520. FIG. 5A also shows a coordinate system includes an X-axis, a Y-axis, and a Z-axis.

The channel region 505 is the channel of a MOSFET in the hybrid FET. The channel region 505 is between the first region 510 and the second region 520 in a direction along the X-axis. One of the first region 510 and the second region 520 is the source of the MOSFET and the other one is the drain of the MOSFET. The first region 510 and the second region 520 are doped with the same type of dopants. In an example where the MOSFET is a NMOS transistor, the first region 510 and the second region 520 are doped with n-type dopants, and the channel region 505 is a p-type region. The NMOS transistor can operate by creating an inversion layer in the channel region 505. This inversion layer, called the n-channel, can conduct electrons between terminals of the first region 510 and the second region 520. The n-channel is created by applying voltage to the gate electrode 560. In an example where the MOSFET is a PMOS transistor, the first region 510 and the second region 520 are doped with p-type dopants, and the channel region 505 is a n-type region. The PMOS transistor can operate by creating an inversion layer in the channel region 505. This inversion layer, called the p-channel, can conduct holes between terminals of the first region 510 and the second region 520. The p-channel can be created by applying a negative voltage to the gate electrode 560.

The semiconductor structure 500 may be an elongated semiconductor structure. The elongated semiconductor structure has a longitudinal axis. The longitudinal axis may be along the X-axis. A dimension of the elongated semiconductor structure along the X-axis may be greater than the dimensions of the semiconductor structure along the Y- and Z-axes. The transverse cross-section (i.e., a cross-section in a plane perpendicular to the longitudinal axis) of the semiconductor structure in the Y-Z plane may have various shapes, such as circular, rectangular, square, triangle, trapezoid, oval, parallelogram, and so on. The semiconductor structure 500 may be a fin, a nanoribbon (the transverse cross-section of which is rectangular), nanowire (the transverse cross-section of which is circular), etc.

As shown in FIG. 5B, the semiconductor structure 550 includes the channel region 505, the first region 510, and a third region 530. FIG. 5B also shows a coordinate system that includes an X-axis, a Y-axis, and a Z-axis. The channel region 505 is between the first region 510 and the third region 530 in a direction along the X-axis. The third region 530 wraps around a part of the channel region 505.

The semiconductor structure 550 includes the channel, source, and drain of a TFET in the hybrid FET. The channel region 505 constitute the channel of the TFET. One of the first region 510 and the third region 530 is the source of the TFET and the other one is the drain of the TFET. The first region 510 and the third region 530 are doped with dopants of opposite types. The TFET operates based on BTBT. For BTBT to occur, an electron in the valence band of semiconductor tunnels across the band gap to the conduction band without the assistance of traps. BTBT can be triggered by applying a gate voltage onto the channel region 505 through the gate electrode 565. The TFET can be operated by applying gate bias so that electron accumulation occurs in the channel region 505. At sufficient gate voltage, BTBT occurs when the conduction band of the channel region 505 aligns with the valence band of the p-type region (i.e., the region doped with p-type dopants, e.g., the first region 510 or the third region 530). Electrons from the valence band of the p-type region tunnel into the conduction band of the channel region 505 and current can flow across the TFET. As the gate voltage is reduced, the bands become misaligned and current can no longer flow. In some embodiments, the TFET is an n-type TFET, in which the source region is doped with p-type dopants and the drain region is doped with n-type dopants. In other embodiments, the TFET is a p-type TFET, in which the source region is doped with n-type dopants and the drain region is doped with p-type dopants.

In some embodiments, the semiconductor structure 550 may be an elongated semiconductor structure having a longitudinal axis and a transverse cross-section perpendicular to the longitudinal axis. The longitudinal axis may be along the X-axis. A dimension of the elongated semiconductor structure along the X-axis may be greater than the dimensions of the semiconductor structure along the Y- and Z-axes. The transverse cross-section (i.e., a cross-section in a plane perpendicular to the longitudinal axis) of the semi-conductor structure in the Y-Z plane may have various shapes, such as circular, rectangular, square, triangle, trapezoid, oval, parallelogram, and so on. The semiconductor structure 550 may be a fin, a nanoribbon (the transverse cross-section of which is rectangular), nanowire (the transverse cross-section of which is circular), etc.

The channel region 505 can form a source-channel interface with the source region of the TFET. In some embodiments, a portion of the source-channel interface is in the source region and another portion of the source-channel interface is in the channel region 505. The source-channel interface may include the dopants in the source region and can be formed through mitigation of the dopants in a direction from the source region to the channel region 505. There can be a gradual change in the concentration of the dopants in the source-channel interface. For instance, the concentration of the dopants in the source-channel interface decreases along the direction from the source region to the channel region 505, i.e., there is less dopants per unit volume as it is father from the source region and closer to the channel region 505. Similarly, the channel region 505 can form a drain-channel interface with the drain region of the TFET. The drain-channel interface may include the dopants in the drain region and can be formed through mitigation of the dopants in a direction from the drain region to the channel region 505. There can be a gradual change in the concentration of the dopants in the drain-channel interface. For instance, the concentration of the dopants in the drain-channel interface decreases along the direction from the drain region to the channel region 505, i.e., there is less dopants per unit volume as it is father from the drain region and closer to the channel region 505. In some embodiments, a length of the drain-channel interface or drain-channel interface along the X-axis is no more than 2 nm.

Example Processes of Forming Hybrid FETs

Figure 6C:
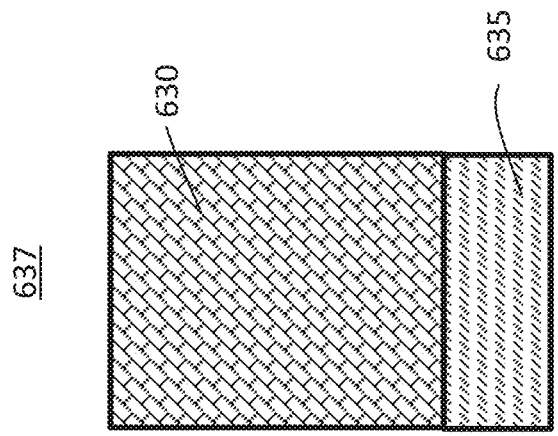
FIG. 6A-6H illustrate an example process of forming a hybrid FET through layer transfer, according to some embodiments of the disclosure.
Figure 6B:
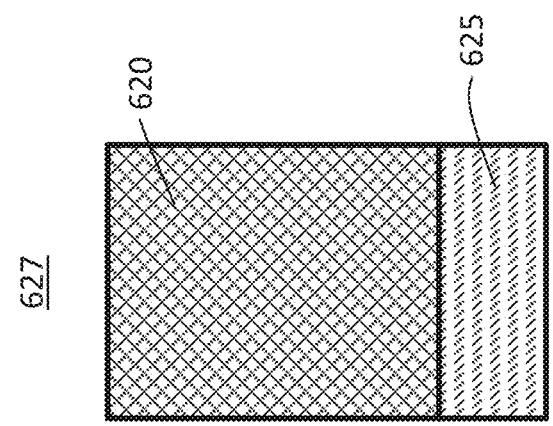
Figure 6A:
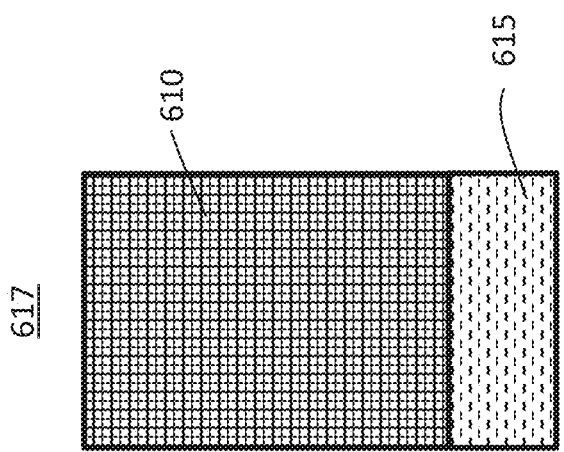

FIGS. 6A-6H illustrate an example process of forming a hybrid FET 600 through layer transfer, according to some embodiments of the disclosure. Layer transfer includes transferring a structure (e.g., a structure of a semiconductor material) from a growth substrate (e.g., a substrate on which the structure is deposited) to a target substrate. FIG. 6A shows a semiconductor structure 610 formed on a growth substrate 615, which generates a structure 617. FIG. 6B shows a semiconductor structure 620 formed on a growth substrate 625, which generates a structure 627. FIG. 6C shows a semiconductor structure 630 formed on a growth substrate 635, which generates a structure 637.

A growth substrate (e.g., the growth substrate 615, 625, or 635) may be any suitable structure on which a semiconductor structure can be grown. The growth substrate may be a semiconductor substrate that includes a semiconductor material. Alternatively, the growth substrate may include other materials, such as glass. The growth substrate may include the same material as the substrate 107. In various embodiments, the growth substrate may include any such substrate material that provides a suitable surface for forming the semiconductor structure.

A semiconductor structure (e.g., the semiconductor structure 610, 620, or 630) includes a semiconductor material. The semiconductor structure may be an embodiment of the first region 110, second region 120, or third region 130 in FIG. 1. The semiconductor structure may be formed by depositing the semiconductor material onto the growth substrate. Various deposition techniques can be used, including, e.g., atomic structure deposition (ALD), chemical vapor deposition (CVD), physical vapor deposition (PVD), etc. Dopants (e.g., n-type dopant or p-type dopant) can be incorporated into the semiconductor material before, during, or after the formation of the semiconductor structure. In an embodiment, the dopant is mixed with a precursor of the semiconductor material and the mixture is sprayed onto the growth substrate to form a doped semiconductor structure. In another embodiment, the dopant is incorporated into a semiconductor structure after the semiconductor structure is formed on the growth substrate.

Figures 6D, 6E:
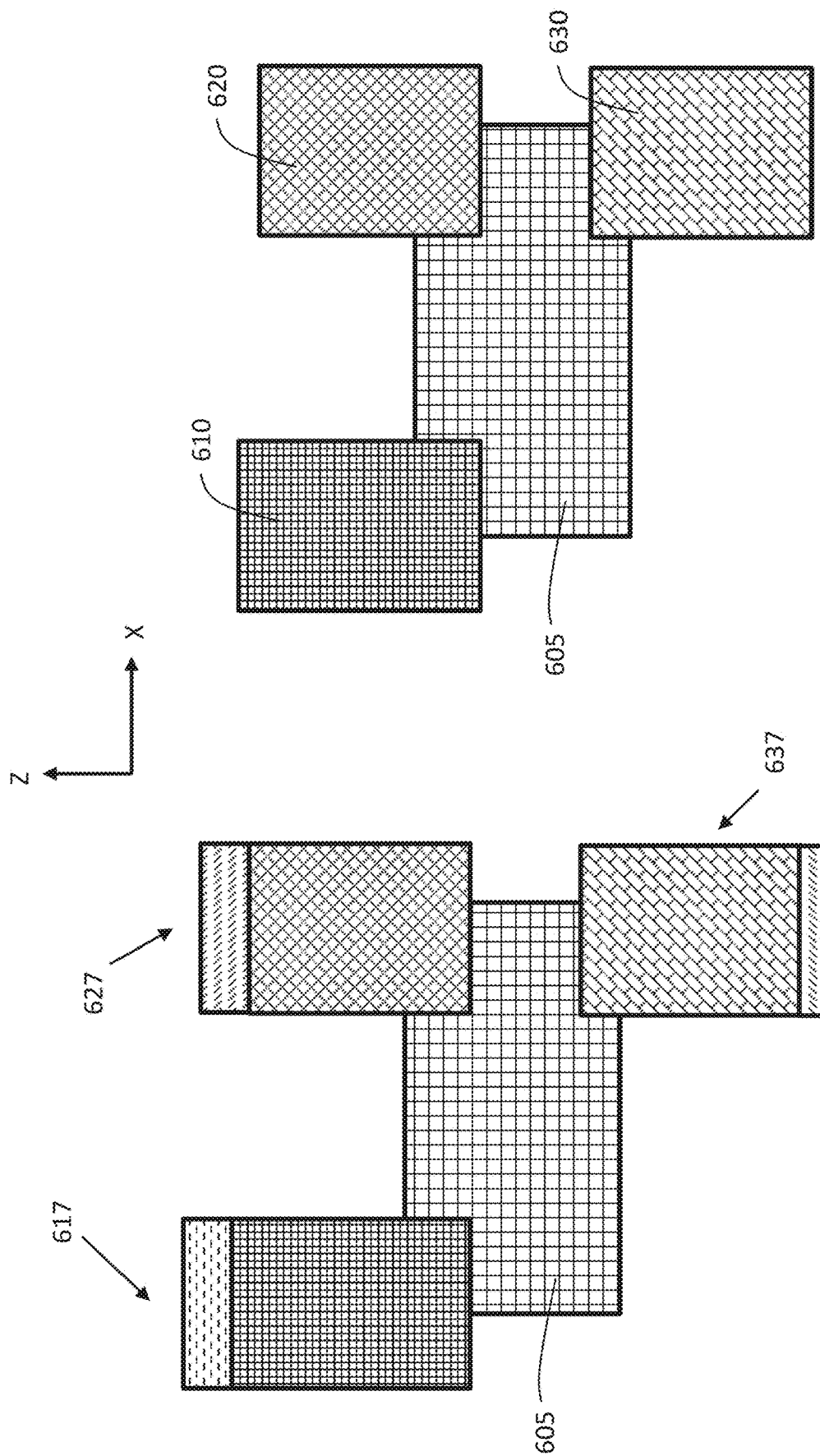

In FIG. 6D, the structures 617, 627, and 637 are bonded to a semiconductor structure 605 with the semiconductor structures 610, 620, and 630 contacting the semiconductor structure 605. The semiconductor structure 605 may be an embodiment of the channel region 105 in FIG. 1. In some embodiments, the structures 617, 627, and 637 and the semiconductor structure 605 are bonded together through a thermal compression process. For instance, each structure is placed over a portion of the semiconductor structure 605 with the semiconductor structure in the structure contacting the portion of the semiconductor structure 605. Then the structure and the semiconductor structure 605 are compressed at a predetermined temperature for a predetermined duration of time to form a bonding between the semiconductor structure and the semiconductor structure 605. The temperature and duration of time can be determined based on the semiconductor materials of the semiconductor structure and the semiconductor structure 605. In some embodiments, an adhesive structure (not shown in FIG. 6D) is used to facilitate the bonding. The adhesive structure may be formed on the semiconductor structure or the semiconductor structure 605, e.g., through spin coating. The adhesive structure may be in a flowable state. The heating during the thermal compression can harden the adhesive structure and form a stable bond between the semiconductor structure and the semiconductor structure 605. An example of the adhesive structure is a hydrogen silsesquioxane (HSQ) structure.

As shown in FIG. 6D, the structure 617 is bonded to a left top portion of the semiconductor structure 605, the structure 627 is bonded to a right top portion of the semiconductor structure 605, and the structure 637 is bonded to a right bottom portion of the semiconductor structure 605. The structures 617 and 627 above the structure 637 along the Z-axis. In other embodiments, the structure 617, 627, or 637 can be bonded to a different portion of the semiconductor structure 605. The structures 617, 627, and 637 can be bonded to the semiconductor structure 605 simultaneously or sequentially. In some embodiments, the structures 617 and 627 are bonded to the semiconductor structure 605 simultaneously before or after the structure 637 is bonded to the semiconductor structure 605.

After the bonding process, the growth substrates 615, 625, and 635 are removed from the structures 617, 627, and 637, respectively, as shown in FIG. 6E. The growth substrate 615 can be removed through various techniques, such as etching, mechanical thinning, epitaxial lift-off, mechanical spalling, laser lift-off, ion cutting, and so on. Through the steps in FIGS. 6A-6E, the semiconductor structures 610, 620, and 630 are "transferred" from their growth substrates 615, 625, and 635 to the semiconductor structure 605, i.e., the target substrate.

Such layer transfer processes can allow the integration of both lattice-matched and mismatched materials for enabling extended functionality and performance by assembling diverse materials or devices in a more compact space. The formation of a semiconductor structure (e.g., the semiconductor structure 610, 620, or 630) may be an epitaxy process, such as one of the epitaxy processes described below in conjunction with FIGS. 7A and 7B and FIGS. 8A-8B. The epitaxy process includes an oriented crystal growth of the semiconductor material on the underlying substrate (e.g., the growth substrate 615, 625, or 635). Accordingly, the crystal orientations of the semiconductor structure 610, 620, or 630 can be controlled separately by using different growth substrates.

The crystal orientation of the semiconductor structure can be determined by the growth substrate. For instance, the semiconductor structure can be formed through homoepitaxial growth if the semiconductor structure and the growth substrate have the same material. With homoepitaxial growth, the crystal structure of the semiconductor structure can match (e.g., identical or substantially identical to) the crystal structure of the growth substrate and the crystal orientation of the semiconductor structure can be aligned with the crystal orientation of the growth substrate, i.e., the two crystal orientations can be the same or substantially same. In embodiments where the semiconductor structures 610, 620, and 630 have the same material, the semiconductor structures 610, 620, and 630 can be formed on identical (or substantially identical) growth substrates (or the same growth substrate if not damaged when removed) and the semiconductor structures 610, 620, and 630 can have aligned crystal orientations. Even when the semiconductor structures 610, 620, and 630 have different materials, their crystal orientations can still be aligned by using different growth substrates. For instance, growth substrates having different materials but the same crystal orientation can be used to form the semiconductor structures 610, 620, and 630. Each of the growth substrate has the same material as the corresponding semiconductor structure so that the crystal orientation of the semiconductor structure will be aligned with the crystal orientation of the growth substrate. That way, the semiconductor structures 610, 620, and 630 will have aligned crystal orientations.

Figure 6G:
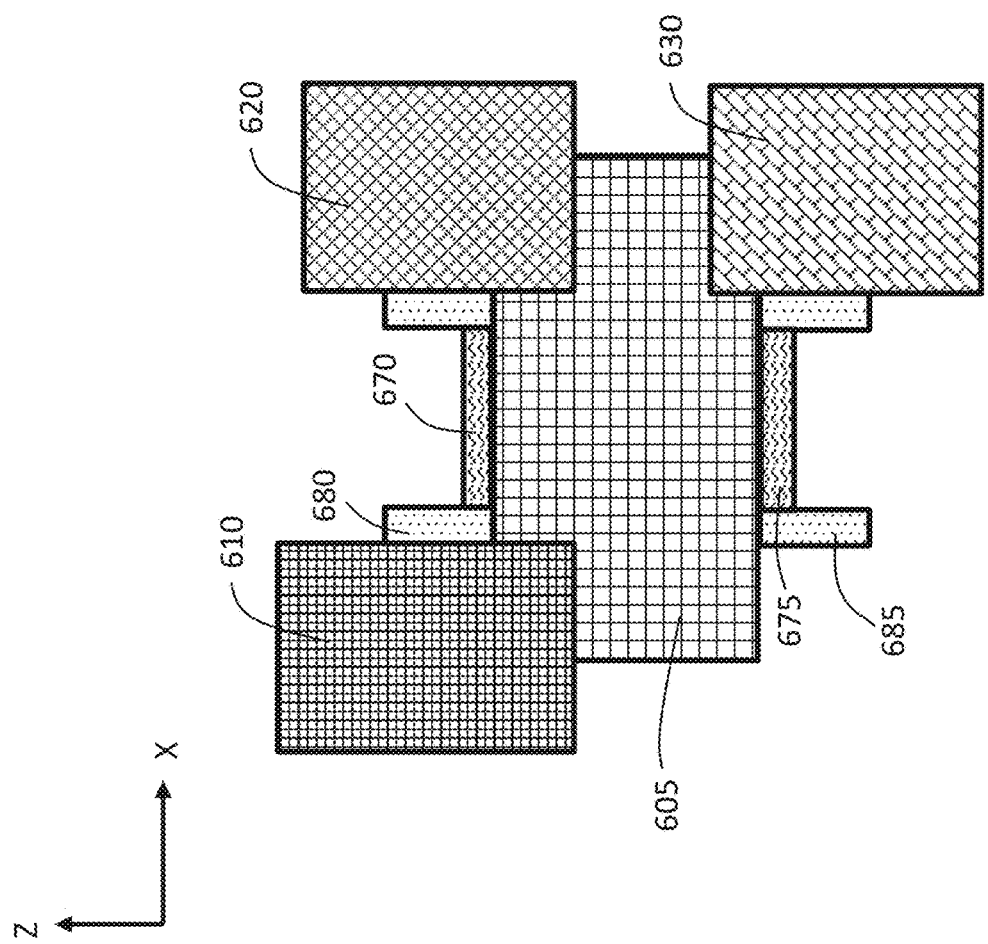
Figure 6F:
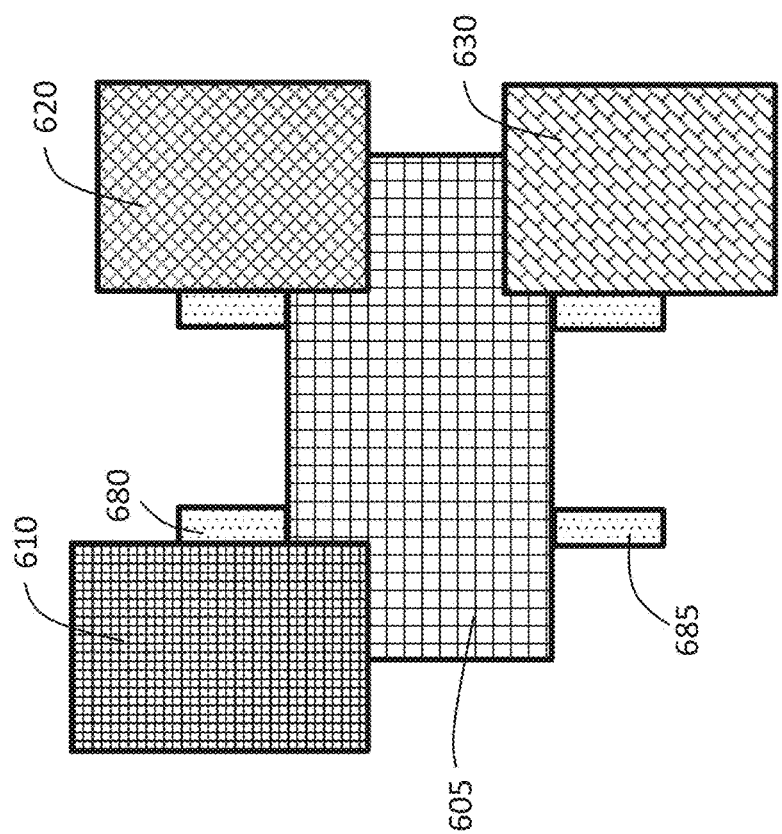

In FIG. 6F, insulators 680 and 685 are formed. The insulator 680 contacts the semiconductor structures 610 and 620. In some embodiments, the insulator 680 is one piece and extends from a side of the semiconductor structure 610 to a side of the semiconductor structure 620. In other embodiments, the insulator 680 includes two pieces: one piece is over at least a portion of the semiconductor structure 610 and the other piece is over at least a portion of the semiconductor structure 620. The insulator 685 contacts the semiconductor structure 630. The insulator 685 may have the same or similar shape as the insulator 680.

In FIG. 6G, insulators 670 and 675 are formed. The insulator 670 is formed over a portion of the semiconductor structure 605. The portion of the semiconductor structure 605 is between the semiconductor structures 610 and 620. The insulator 670 may be wrapped around by the insulator 680. The insulator 675 is formed over another portion of the semiconductor structure 605. The insulator 675 may be wrapped around by the insulator 685. As shown in FIG. 6G, the insulators 670 and 680 are over the top surface of the semiconductor structure 605 but the insulators 675 and 685 are over the bottom surface of the semiconductor structure 605. In other embodiments, the insulators 670*m* 680, 675, and 685 may have different locations.

In some embodiments, an insulator (e.g., the insulators 670*m* 680, 675, and 685) may be deposited using a conformal deposition process, such as ALD or CVD. Conformal deposition generally refers to deposition of a certain coating on any exposed surface of a given structure. A conformal coating may, therefore, be understood as a coating that is applied to exposed surfaces of a given structure, and not, for example, just to the vertical surfaces. In some embodiments, an annealing process may be carried out on the insulator to improve the quality of the insulator.

Figure 6H:
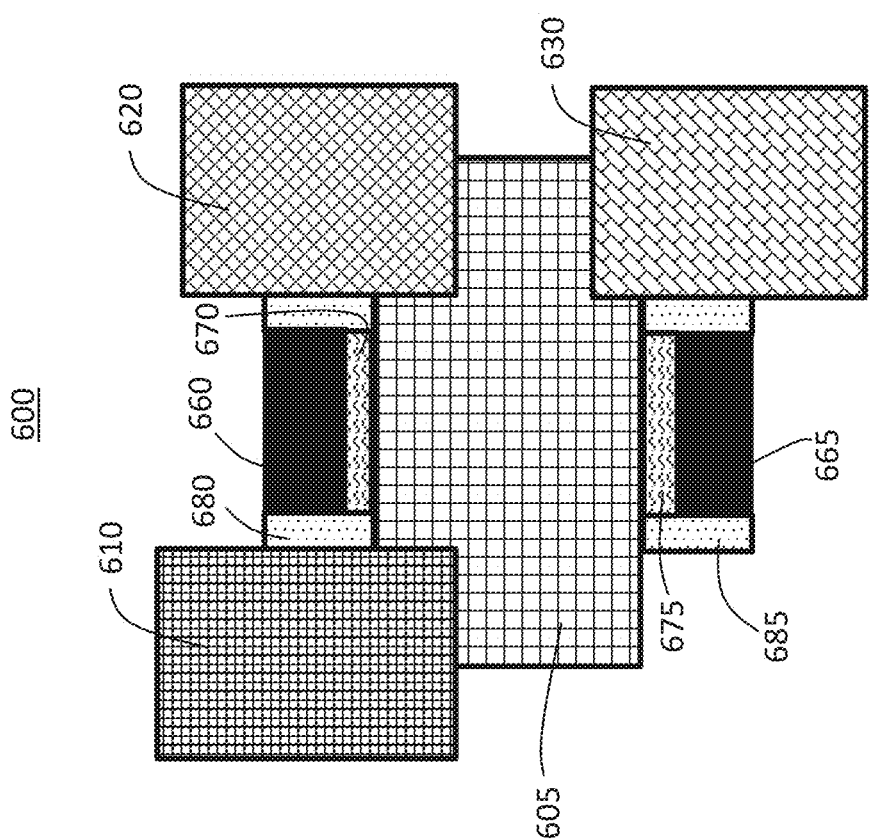

In FIG. 6H, electrodes 660 and 665 are formed and the hybrid FET 600 is generated. The electrode 660 is over the insulator 670. The insulator 670 is between the electrode 660 and the semiconductor structure 605 so that the semiconductor structure 605 is separated from the electrode 660 from the insulator 670. The electrode 660 is wrapped around by the insulator 680 and is separated from the semiconductor structures 610 and 620 by the insulator 680. The electrode 665 is over the insulator 675 and is separated from the semiconductor structure 605 by the insulator 670. The electrode 666 is wrapped around by the insulator 686 and is separated from the semiconductor structure 630 by the insulator 680. The electrode 660 or 665 may be formed by depositing a conductive material onto the insulator 670 or 675.

Figure 7B:
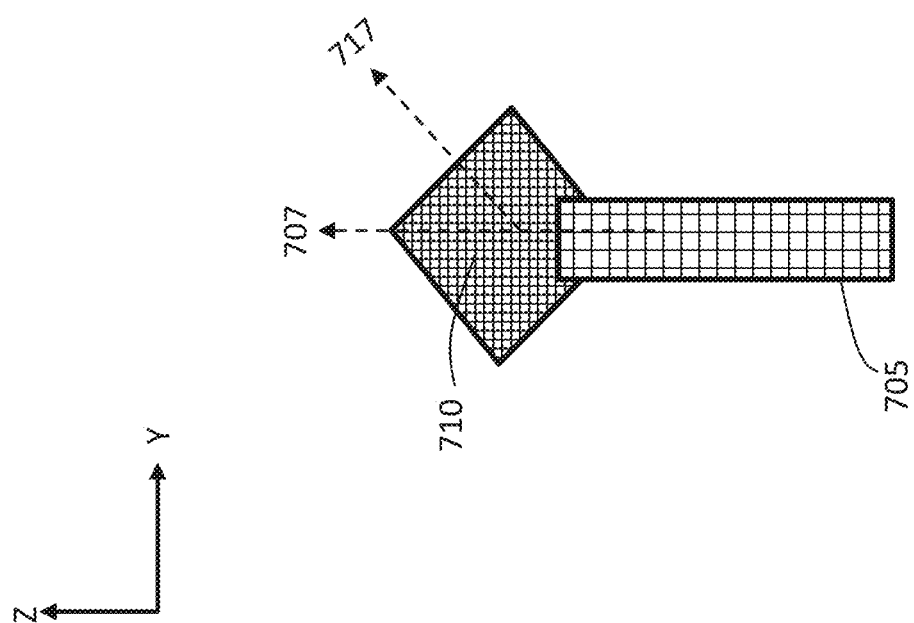
FIGS. 7A and 7B illustrate an example process of forming a semiconductor structure through epitaxy, according to some embodiments of the disclosure.
Figure 7A:
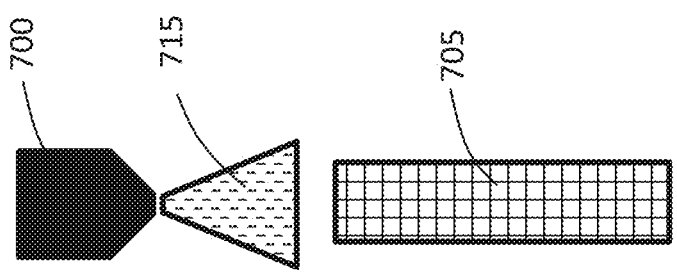

FIGS. 7A and 7B illustrate an example process of forming a semiconductor structure through epitaxy, according to some embodiments of the disclosure. The epitaxy includes crystal growth of a semiconductor material on an underlying layer. The epitaxy may be a liquid phase epitaxy, a molecular beam epitaxy, a CVD epitaxy (e.g., metalorganic CVD epitaxy), etc.

FIG. 7A shows a spraying assembly 700 sprays a fluid 715 onto a semiconductor structure 705. The semiconductor structure 705 may be an embodiment of the channel region 105 in FIG. 1. The fluid 715 may be a gas, liquid, or supercritical fluid. The fluid 715 includes one or more precursors of a semiconductor material. A precursor may include the semiconductor material or one or more chemical elements of the semiconductor material. The semiconductor material may be formed through a chemical reaction between multiple precursors, chemical reaction between a precursor and the semiconductor structure 705, chemical reaction between a precursor and a material in the environment (e.g., a deposition chamber), or some combination thereof. The semiconductor material is different from the material of the semiconductor structure 705, i.e., the epitaxy in FIGS. 7A and 7B is heteroepitaxy. The fluid 715 may also include other materials, such as an n-type or p-type dopant.

In some embodiments, the spraying of the fluid 715 is performed in a chamber. The chamber may provide a controlled environment with a predetermined temperature or pressure. For example, the chamber provides a vacuum environment (e.g., a pressure of $10^{-8}$-$10^{-12}$ Torr) to prevent contamination. As another example, the chamber has a temperature and pressures to maintain the phase of the precursor, which may be gas, liquid, or superfluid. In some embodiments, the chamber may include plasma that facilitates the spraying of the fluid 715. For example, before the fluid 715 is sprayed onto the semiconductor structure 705, at least a portion of the semiconductor structure 705 can be treated with plasma to make the semiconductor structure 705 ready for the deposition, e.g., by removing contaminants from the semiconductor structure 705. As another example, the chamber can provide plasmas after the fluid 715 is sprayed onto the semiconductor structure 705. The plasma facilitates solidification or crystallization of the semiconductor material on the semiconductor structure 705. In other embodiments, the solidification or crystallization can be done through radiation, heat, or other methods.

In FIG. 7B, a semiconductor structure 710 is formed over the semiconductor structure 705. The semiconductor structure 710 may be an embodiment of the first region 110 in FIG. 1. As the semiconductor material of the semiconductor structure 710 is different from the material of the semiconductor structure 705, the semiconductor structure 710 is formed through heteroepitaxial growth. There can be a misalignment between the crystal structures (e.g., lattice mismatch) in the two semiconductor structures 705 and 710, which may result in a tilted growth of the semiconductor structure 710. As shown in FIG. 7B, the crystal orientation 717 of the semiconductor structure 710 is different from the crystal orientation 707 of the semiconductor structure 705. Also, a portion of the semiconductor structure 705 is wrapped around by the semiconductor structure 710. Even though not shown in FIGS. 7A and 7B, more semiconductor structures can be formed on the semiconductor structure 705 through epitaxy.

Figure 8B:
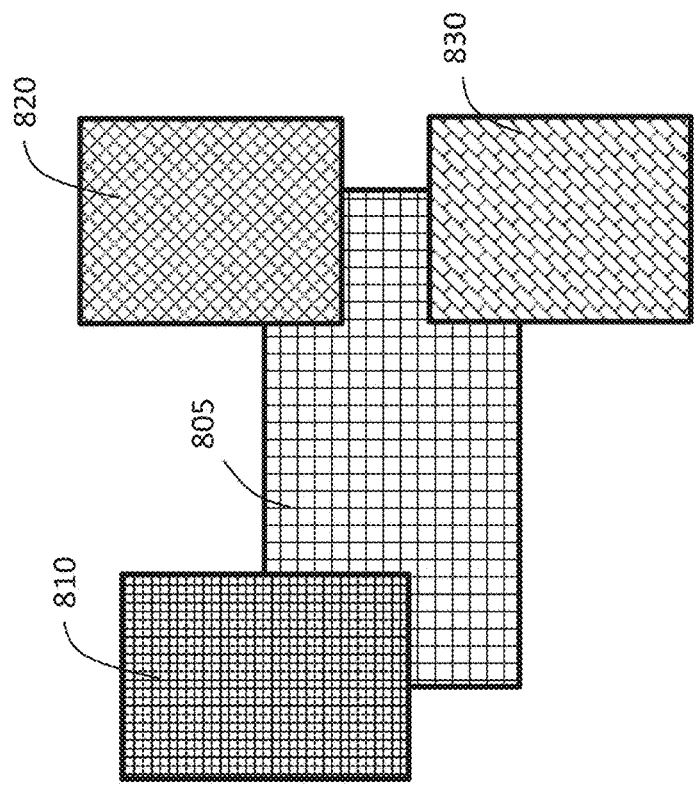
FIGS. 8A and 8B illustrate an example process of forming a hybrid FET through chemoepitaxy, according to some embodiments of the disclosure.
Figure 8A:
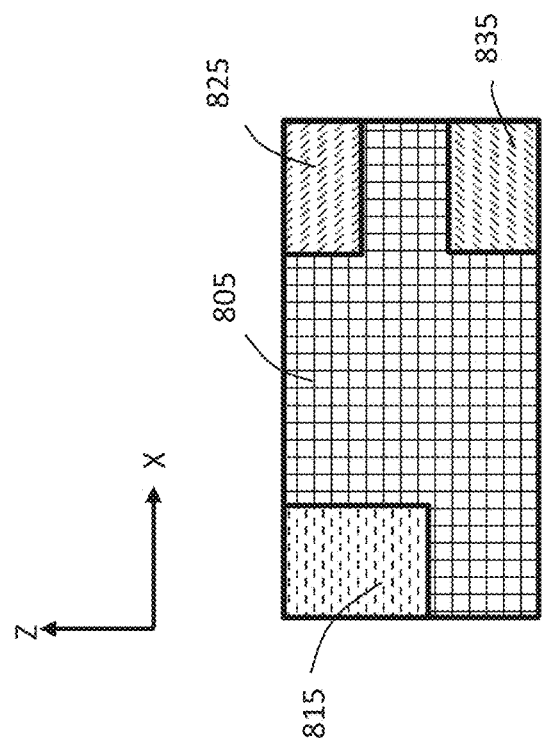

FIGS. 8A and 8B illustrate an example process of forming a hybrid FET through chemoepitaxy, according to some embodiments of the disclosure. The chemoepitaxy includes crystal growth guided by a chemical guiding pattern on an underlying layer. The graphoepitaxy may be a liquid phase epitaxy, a molecular beam epitaxy, a CVD epitaxy (e.g., metalorganic CVD epitaxy), etc.

FIG. 8A shows a semiconductor structure 805, which may be an embodiment of the channel region 105. Seed layers 815, 825, and 835 are formed on different portions of the semiconductor structure 805. A seed layer can function as a chemical guiding pattern for epitaxial growth of a new semiconductor layer on the semiconductor structure 805 and orient the crystal growth of the new semiconductor layer. For instance, the seed layer can align a crystal orientation of the new semiconductor layer with a particular direction, e.g., the crystal orientation of the semiconductor structure 805. In some embodiments, the seed layer includes oriented grains of a material. The seed layer 825 may be formed by depositing a small amount of the material, heating the surface to form isolated oriented grains, and then using these grains as seeds for the deposition of an oriented layer. The seed layer may have a thickness less than 1 μm.

In FIG. 8B, semiconductor structures 810, 820, and 830 are formed on the semiconductor structure 805. The formation of a semiconductor structure is guided by a seed layer so that the semiconductor structure can have an orientation along the orientation of the grains in the seed layer. In some embodiments, the orientation of the grains in the seed layers 815, 825, and 835 are aligned so that the semiconductor structures 810, 820, and 830 can have aligned orientations.

Example Methods of Forming IC Devices

Figure 9:
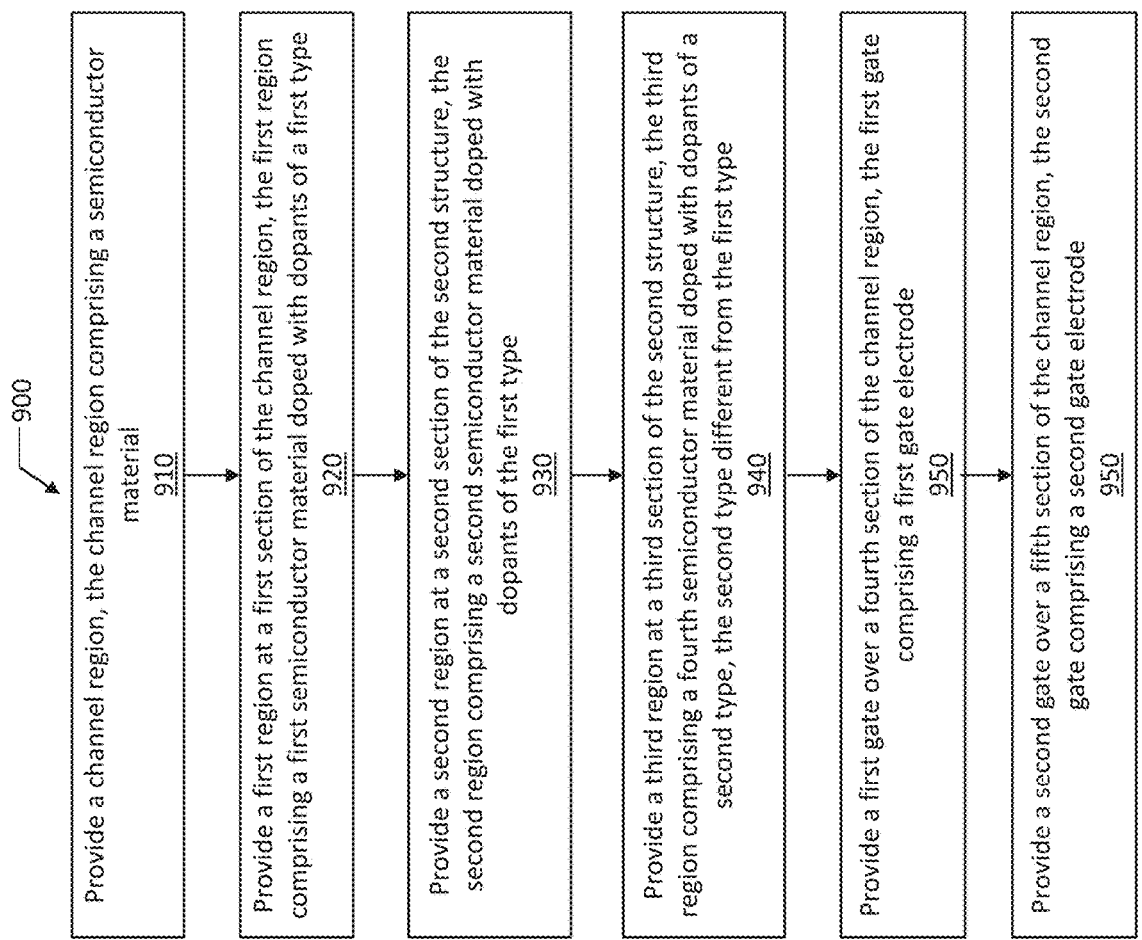
FIG. 9 is a flowchart showing a method forming an IC device, in accordance with various embodiments.

FIG. 9 is a flowchart showing a method 900 forming an IC device, in accordance with various embodiments. In some embodiments, the method 900 includes instructions that are stored in one or more non-transitory computer-readable media and are executable by a processing device, e.g., the processing device 2402 in FIG. 14. Although the method 900 is described with reference to the flowchart illustrated in FIG. 9, many other methods for forming IC devices may alternatively be used. For example, the order of execution of the steps in FIG. 9 may be changed. As another example, some of the steps may be changed, eliminated, or combined.

The method 900 includes providing (e.g., forming) 910 a channel region. The channel region includes a semiconductor material, such as one of the channel materials described above in conjunction with FIG. 1. The method also includes providing 920 a first region at a first section of the channel region. The first region includes a first semiconductor material with dopants of a first type. The method also includes providing 930 a second region at a second section of the second structure. The second region includes a second semiconductor material with dopants of the first type. The second semiconductor material may be the same as the first semiconductor material. The method also includes providing 940 a third region at a third section of the second structure. The third region includes a fourth semiconductor material with dopants of a second type. The second type is different from (e.g., opposite) the first type.

In some embodiments, the first region is formed over a substrate, which generates a combined structure (e.g., the structure 617 in FIG. 6A). The combined structure is boned to the first section of the channel region with the first region touching the first section. Then the substrate is removed. In other embodiments, the first region is formed through an epitaxy growth on the first section of the channel region. The epitaxy growth may be a homoepitaxial growth, a heteroepitaxial growth, or a chemoepitaxy growth that is guided by a chemical guiding pattern.

The method also includes providing 950 a first gate over a fourth section of the channel region. The first gate includes a first gate electrode. The fourth section is between the first section and the second section. The first gate may also include a gate insulator that separates the gate electrode from the first region or the second region and another insulator that separates the fourth section from the first gate electrode.

The method also includes providing 950 providing a second gate over a fifth section of the channel region. The second gate includes a second gate electrode. The fifth section is between the first section and the third section. The second gate may also include a second gate insulator that separates the gate electrode from the first region or the third region and another insulator that separates the fifth section from the second gate electrode.

Figure 10:
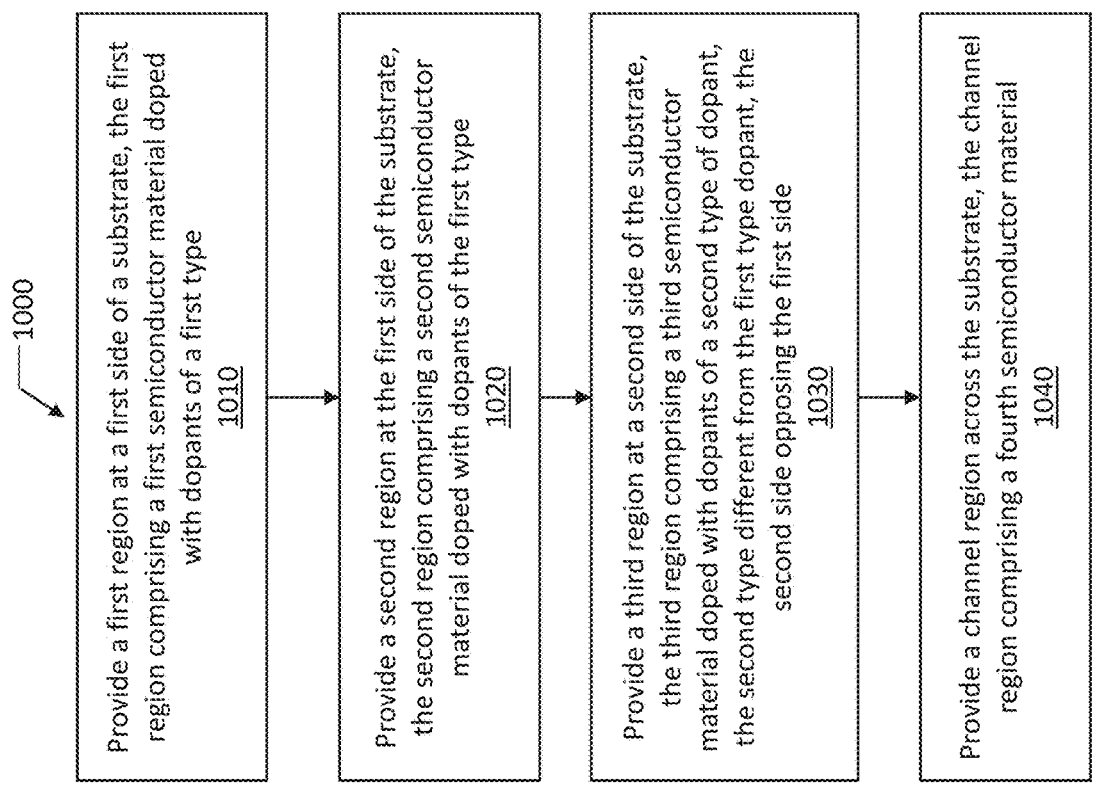
FIG. 10 is a flowchart showing another method of forming an IC device, in accordance with various embodiments.

FIG. 10 is a flowchart showing another method of forming an IC device, in accordance with various embodiments. In some embodiments, the method 1000 includes instructions that are stored in one or more non-transitory computer-readable media and are executable by a processing device, e.g., the processing device 2402 in FIG. 14. Although the method 1000 is described with reference to the flowchart illustrated in FIG. 10, many other methods for forming IC devices may alternatively be used. For example, the order of execution of the steps in FIG. 10 may be changed. As another example, some of the steps may be changed, eliminated, or combined.

The method 1000 includes providing 1010 (e.g., forming) a first region at a first side of a substrate. The first region includes a first semiconductor material with dopants of a first type. The method also includes providing 1020 a second region at the first side of the substrate. The second region includes a second semiconductor material with dopants of the first type. The first region and the second region are a first pair of a source region and a drain region, e.g., the source and drain of a MOSFET.

The method also includes providing 1030 a third region at a second side of the substrate. The third region includes a third semiconductor material with dopants of a second type. The second type is different from (e.g., opposite) the first type. In an example, the first type is n-type and the second type is p-type. In another example, the first type is p-type and the second type is n-type. The second side is opposite the first side. The first region and the third region are a second pair of a source region and a drain region, e.g., the source and drain of a TFET.

The method also includes providing 1040 a channel region across the substrate. The channel region includes a fourth semiconductor material. The channel region is coupled to the first pair and the second pair. In some embodiments, a gate is formed between the first region and the second region. The gate includes a gate electrode, a first gate insulator, and a second gate insulator. An additional gate is formed between the first region and the third region. The additional gate includes an additional gate electrode, an additional first gate insulator, and an additional second gate insulator. The gate electrode and the additional gate electrode may be separated by an insulator or may be electrically coupled.

Example Wafer and Die

Figure 11B:
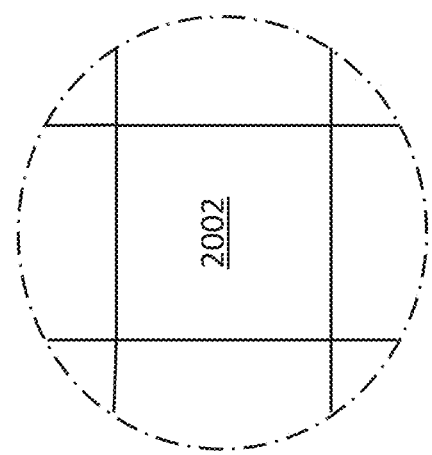
FIGS. 11A-11B are top views of a wafer and dies that may include one or more hybrid FETs, according to some embodiments of the disclosure.
Figure 11A:
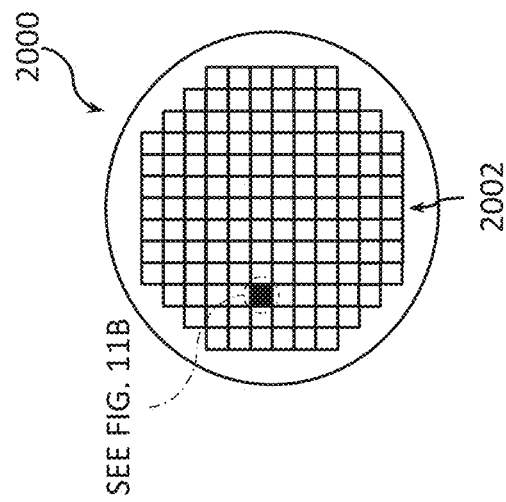

FIGS. 11A-11B are top views of a wafer 2000 and dies 2002 that may include one or more hybrid FETs, according to some embodiments of the disclosure. In some embodiments, the dies 2002 may be included in an IC package, according to some embodiments of the disclosure. For example, any of the dies 2002 may serve as any of the dies 2256 in an IC package 2200 shown in FIG. 12. The wafer 2000 may be composed of semiconductor material and may include one or more dies 2002 having IC devices formed on a surface of the wafer 2000. Each of the dies 2002 may be a repeating unit of a semiconductor product that includes any suitable IC (e.g., ICs including one or more hybrid FETs as described herein). After the fabrication of the semiconductor product is complete (e.g., after manufacture of one or more hybrid FETs as described herein), the wafer 2000 may undergo a singulation process in which each of the dies 2002 is separated from one another to provide discrete "chips" of the semiconductor product. In particular, devices that include one or more hybrid FETs as disclosed herein may take the form of the wafer 2000 (e.g., not singulated) or the form of the die 2002 (e.g., singulated). The die 2002 may include one or more diodes, one or more transistors (e.g., one or more hybrid FETs as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an electrostatic discharge (ESD) protection device, a radio frequency (RF) FE device, a memory device (e.g., a static random-access memory (SRAM) device), a logic device (e.g., an AND, OR, NAND, or NOR gate), or any other suitable circuit element. Multiple ones of these devices may be combined on a single die 2002.

Example IC Package

Figure 12:
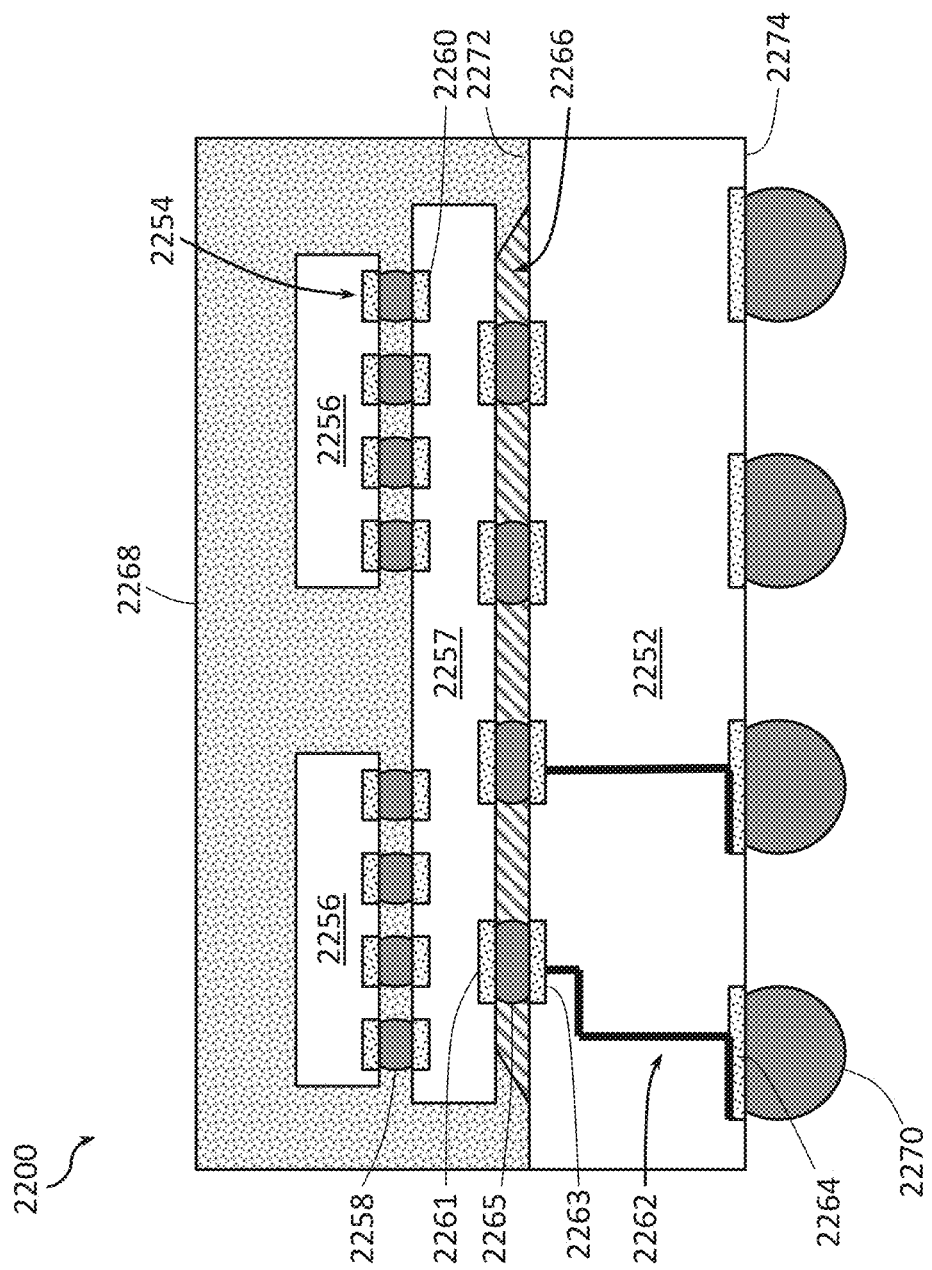
FIG. 12 is a side, cross-sectional view of an example IC package that may include one or more IC devices having hybrid FETs, according to some embodiments of the disclosure.

FIG. 12 is a side, cross-sectional view of an example IC package 2200 that may include one or more IC devices having hybrid FETs, according to some embodiments of the disclosure. In some embodiments, the IC package 2200 may be a system-in-package (SiP).

As shown in FIG. 12, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 12 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 12 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 12 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 13.

The dies 2256 may take the form of any of the embodiments of the die 2002 discussed herein and may include any of the embodiments of an IC device having one or more hybrid FETs. In embodiments in which the IC package 2200 includes multiple dies 2256, the IC package 2200 may be referred to as a multi-chip package. Importantly, even in such embodiments of a multi-chip package (MCP) implementation of the IC package 2200, one or more hybrid FETs may be provided in a single chip, in accordance with any of the embodiments described herein. The dies 2256 may include circuitry to perform any desired functionality. For example, one or more of the dies 2256 may be ESD protection dies, including one or more hybrid FETs as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more hybrid FETs, e.g., as discussed above; in some embodiments, at least some of the dies 2256 may not include any III-N diodes with n-doped wells and capping layers.

The IC package 2200 illustrated in FIG. 12 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 12, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Example IC Device

Figure 13:
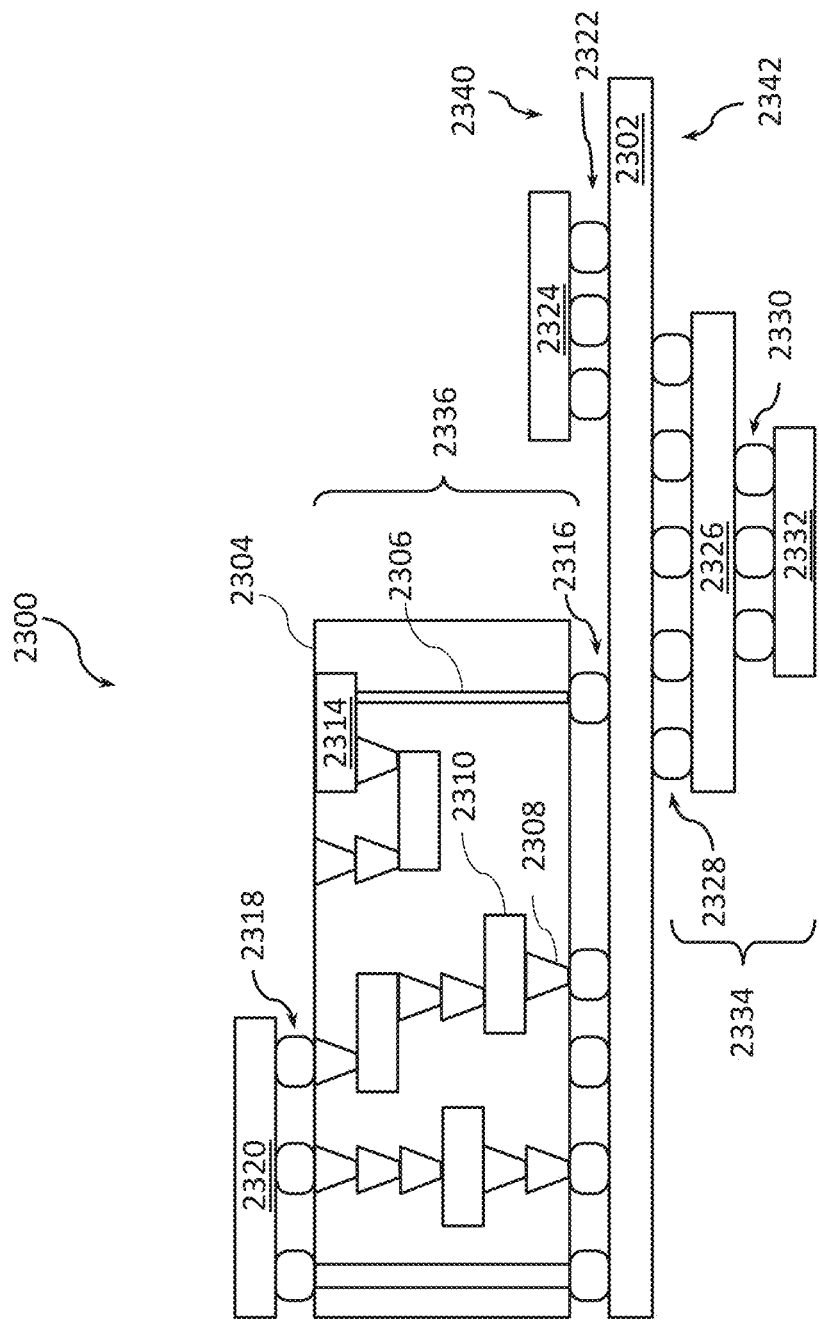
FIG. 13 is a cross-sectional side view of an IC device assembly that may include components having one or more IC devices implementing hybrid FETs, according to some embodiments of the disclosure.

FIG. 13 is a cross-sectional side view of an IC device assembly 2300 that may include components having one or more IC devices implementing hybrid FETs, according to some embodiments of the disclosure. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more hybrid FETs in accordance with any of the embodiments disclosed herein; e.g., any of the IC packages discussed below with reference to the IC device assembly 2300 may take the form of any of the embodiments of the IC package 2200 discussed above with reference to FIG. 12 (e.g., may include one or more hybrid FETs in/on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 13 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 13), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 11B), an IC device (e.g., the IC device of FIGS. 1-2), or any other suitable component. In particular, the IC package 2320 may include one or more hybrid FETs as described herein. Although a single IC package 2320 is shown in FIG. 13, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 13, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other Group III-V and Group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more hybrid FETs as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 13 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Example Computing Device

Figure 14:
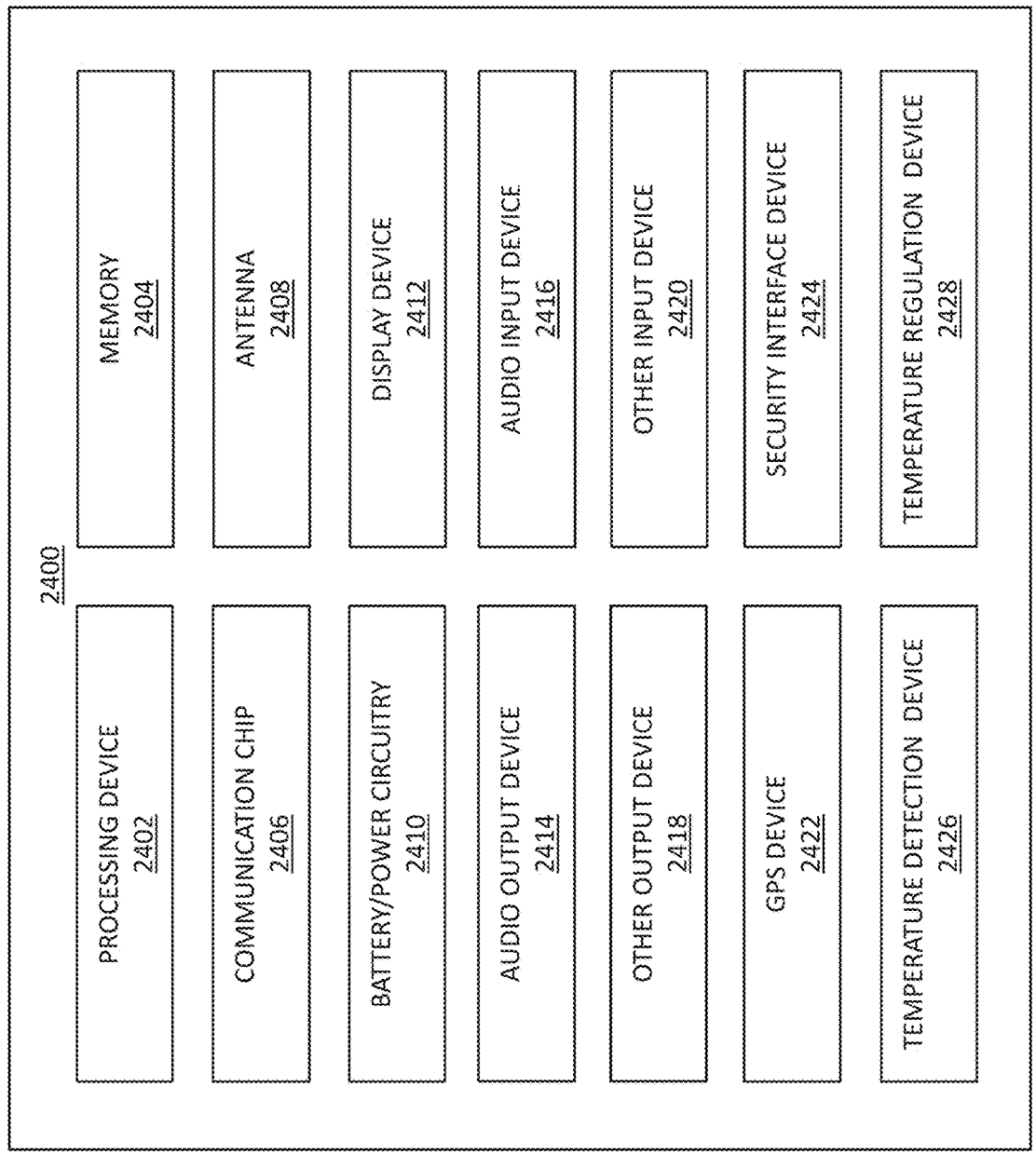
FIG. 14 is a block diagram of an example computing device that may include one or more components with hybrid FETs, according to some embodiments of the disclosure.

FIG. 14 is a block diagram of an example computing device 2400 that may include one or more components including one or more hybrid FETs in accordance with any of the embodiments disclosed herein. For example, any suitable ones of the components of the computing device 2400 may include a die (e.g., the die 2002 (FIG. 11B)) having one or more hybrid FETs. Any one or more of the components of the computing device 2400 may include, or be included in, an IC device 2200 (FIG. 12). Any one or more of the components of the computing device 2400 may include, or be included in, an IC device assembly 2300 (FIG. 13).

A number of components are illustrated in FIG. 14 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 14, but the computing device 2400 may include interface circuitry for coupling to the one or more components. For example, the computing device 2400 may not include a display device 2412, but may include display device interface circuitry (e.g., a connector and driver circuitry) to which a display device 2412 may be coupled. In another set of examples, the computing device 2400 may not include an audio input device 2416 or an audio output device 2414, but may include audio input or output device interface circuitry (e.g., connectors and supporting circuitry) to which an audio input device 2416 or audio output device 2414 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM, nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded DRAM (eDRAM) or spin transfer torque magnetic random-access memory (STT-MRAM).

In some embodiments, the computing device 2400 may include a communication chip 2406 (e.g., one or more communication chips). For example, the communication chip 2406 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2406 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2406 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2406 may operate in accordance with other wireless protocols in other embodiments. The computing device 2400 may include an antenna 2408 to facilitate wireless communications and/or to receive other wireless communications (such as AM or FM radio transmissions).

In some embodiments, the communication chip 2406 may manage wired communications, such as electrical, optical, or any other suitable communication protocols (e.g., the Ethernet). As noted above, the communication chip 2406 may include multiple communication chips. For instance, a first communication chip 2406 may be dedicated to shorter-range wireless communications such as Wi-Fi or Bluetooth, and a second communication chip 2406 may be dedicated to longer-range wireless communications such as global positioning system (GPS), EDGE, GPRS, CDMA, WiMAX, LTE, EV-DO, or others. In some embodiments, a first communication chip 2406 may be dedicated to wireless communications, and a second communication chip 2406 may be dedicated to wired communications.

The computing device 2400 may include a battery/power circuitry 2410. The battery/power circuitry 2410 may include one or more energy storage devices (e.g., batteries or capacitors) and/or circuitry for coupling components of the computing device 2400 to an energy source separate from the computing device 2400 (e.g., AC line power).

The computing device 2400 may include a display device 2412 (or corresponding interface circuitry, as discussed above). The display device 2412 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2414 (or corresponding interface circuitry, as discussed above). The audio output device 2414 may include any device that generates an audible indicator, such as speakers, headsets, or earbuds, for example.

The computing device 2400 may include an audio input device 2416 (or corresponding interface circuitry, as discussed above). The audio input device 2416 may include any device that generates a signal representative of a sound, such as microphones, microphone arrays, or digital instruments (e.g., instruments having a musical instrument digital interface (MIDI) output).

The computing device 2400 may include an other output device 2418 (or corresponding interface circuitry, as discussed above). Examples of the other output device 2418 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may include a GPS device 2422 (or corresponding interface circuitry, as discussed above). The GPS device 2422 may be in communication with a satellite-based system and may receive a location of the computing device 2400, as known in the art.

The computing device 2400 may include a security interface device 2424. The security interface device 2424 may include any device that provides security features for the computing device 2400 or for any individual components therein (e.g., for the processing device 2402 or for the memory 2404). Examples of security features may include authorization, access to digital certificates, access to items in keychains, etc. Examples of the security interface device 2424 may include a software firewall, a hardware firewall, an antivirus, a content filtering device, or an intrusion detection device.

In some embodiments, the computing device 2400 may include a temperature detection device 2426 and a temperature regulation device 2428.

The temperature detection device 2426 may include any device capable of determining temperatures of the computing device 2400 or of any individual components therein (e.g., temperatures of the processing device 2402 or of the memory 2404). In various embodiments, the temperature detection device 2426 may be configured to determine temperatures of an object (e.g., the computing device 2400, components of the computing device 2400, devices coupled to the computing device, etc.), temperatures of an environment (e.g., a data center that includes, is controlled by, or otherwise associated with the computing device 2400), and so on. The temperature detection device 2426 may include one or more temperature sensors. Different temperature sensors of the temperature detection device 2426 may have different locations within and around the computing device 2400. A temperature sensor may generate data (e.g., digital data) representing detected temperatures and provide the data to another device, e.g., to the temperature regulation device 2428, the processing device 2402, the memory 2404, etc. In some embodiments, a temperature sensor of the temperature detection device 2426 may be turned on or off, e.g., by the processing device 2402 or an external system. The temperature sensor detects temperatures when it is on and does not detect temperatures when it is off. In other embodiments, a temperature sensor of the temperature detection device 2426 may detect temperatures continuously and automatically or detect temperatures at predefined times or at times triggered by an event associated with the computing device 2400 or any components therein.

The temperature regulation device 2428 may include any device configured to change (e.g., decrease) temperatures, e.g., based on one or more target temperatures and/or based on temperature measurements performed by the temperature detection device 2426. A target temperature may be a preferred temperature. A target temperature may depend on a setting in which the computing device 2400 operates. In some embodiments, the target temperature may be 200 Kelvin degrees or lower. In some embodiments, the target temperature may be 20 Kelvin degrees or lower, or 5 Kelvin degrees or lower. Target temperatures for different objects and different environments of, or associated with, the computing device 2400 can be different. In some embodiments, cooling provided by the temperature regulation device 2428 may be a multi-stage process with temperatures ranging from room temperature to 4K or lower.

In some embodiments, the temperature regulation device 2428 may include one or more cooling devices. Different cooling device may have different locations within and around the computing device 2400. A cooling device of the temperature regulation device 2428 may be associated with one or more temperature sensors of the temperature detection device 2426 and may be configured to operate based on temperatures detected the temperature sensors. For instance, a cooling device may be configured to determine whether a detected ambient temperature is above the target temperature or whether the detected ambient temperature is higher than the target temperature by a predetermined value or determine whether any other temperature-related condition associated with the temperature of the computing device 2400 is satisfied. In response to determining that one or more temperature-related condition associated with the temperature of the computing device 2400 are satisfied (e.g., in response to determining that the detected ambient temperature is above the target temperature), a cooling device may trigger its cooling mechanism and start to decrease the ambient temperature. Otherwise, the cooling device does not trigger any cooling. A cooling device of the temperature regulation device 2428 may operate with various cooling mechanisms, such as evaporation cooling, radiation cooling, conduction cooling, convection cooling, other cooling mechanisms, or any combination thereof. A cooling device of the temperature regulation device 2428 may include a cooling agent, such as a water, oil, liquid nitrogen, liquid helium, etc. In some embodiments, the temperature regulation device 2428 may be, for example, a dilution refrigerator, a helium-3 refrigerator, or a liquid helium refrigerator. In some embodiments, the temperature regulation device 2428 or any portions thereof (e.g., one or more of the individual cooling devices) may be connected to the computing device 2400 in close proximity (e.g., less than about 1 meter) or may be provided in a separate enclosure where a dedicated heat exchanger (e.g., a compressor, a heating, ventilation, and air conditioning (HVAC) system, liquid helium, liquid nitrogen, etc.) may reside.

By maintaining the target temperatures, the energy consumption of the computing device 2400 (or components thereof) can be reduced, while the computing efficiency may be improved. For example, when the computing device 2400 (or components thereof) operates at lower temperatures, energy dissipation (e.g., heat dissipation) may be reduced. Further, energy consumed by semiconductor components (e.g., energy needed for switching transistors of any of the components of the computing device 2400) can also be reduced. Various semiconductor materials may have lower resistivity and/or higher mobility at lower temperatures. That way, the electrical current per unit supply voltage may be increased by lowering temperatures. Conversely, for the same current that would be needed, the supply voltage may be lowered by lowering temperatures. As energy correlates to the supply voltage, the energy consumption of the semiconductor components may lower too. In some implementations, the energy savings due to reducing heat dissipation and reducing energy consumed by semiconductor components of the computing device or components thereof may outweigh (sometimes significantly outweigh) the costs associated with energy needed for cooling.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

Figure 15:
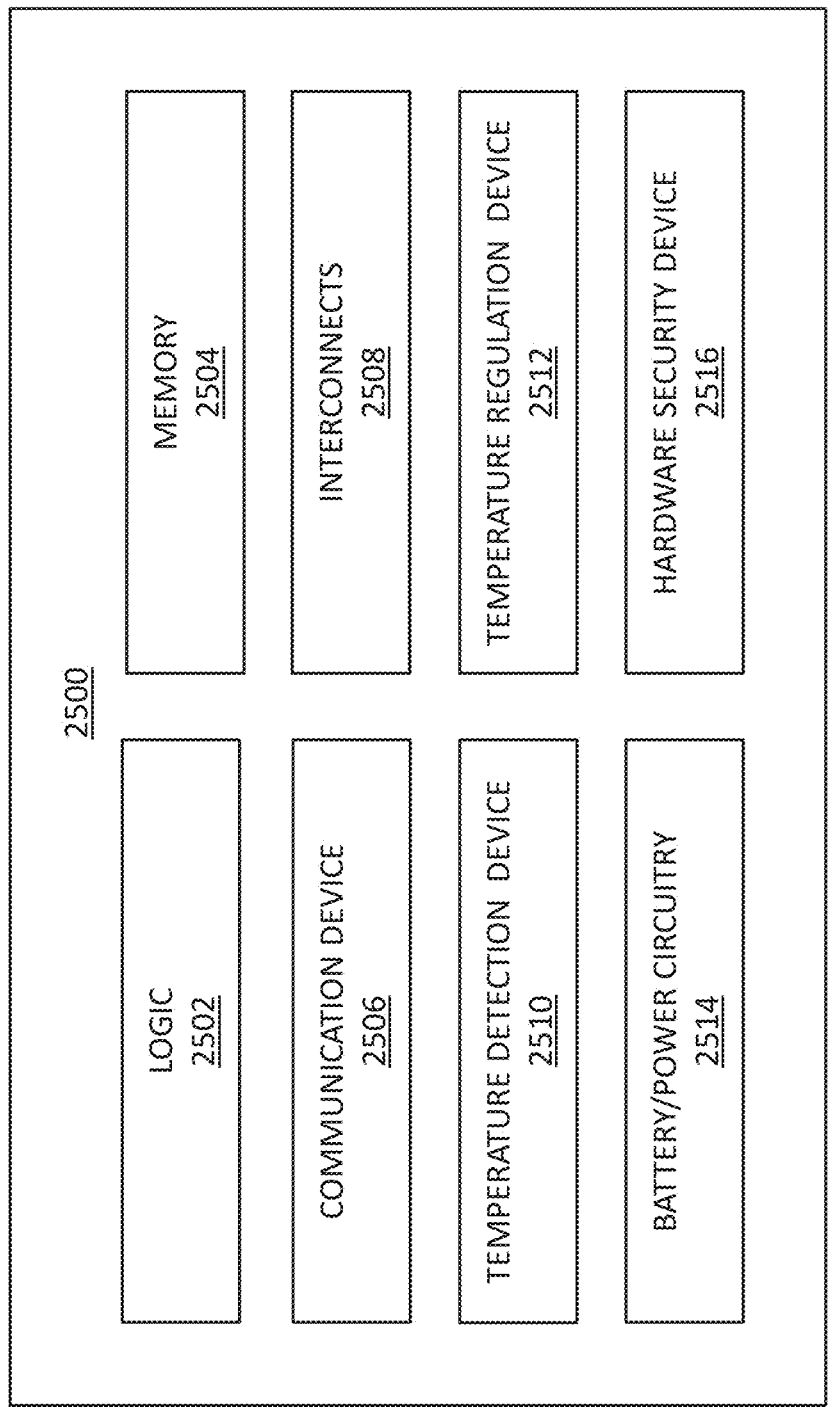
FIG. 15 is a block diagram of an example processing device that may include one or more hybrid FETs, according to some embodiments of the disclosure.

FIG. 15 is a block diagram of an example processing device 2500 that may include one or more hybrid FETs in accordance with any of the embodiments disclosed herein. For example, any suitable ones of the components of the processing device 2500 may include a die (e.g., the die 2002 (FIG. 11B)) having one or more hybrid FETs. Any one or more of the components of the processing device 2500 may include, or be included in, an IC device 2200 (FIG. 12). Any one or more of the components of the processing device 2500 may include, or be included in, an IC device assembly 2300 (FIG. 13). Any one or more of the components of the processing device 2500 may include, or be included in, a computing device 2400 (FIG. 14); for example, the processing device 2500 may be the processing device 2402 of the computing device 2400.

A number of components are illustrated in FIG. 15 as included in the processing device 2500, but any one or more of these components may be omitted or duplicated, as suitable for the application. In some embodiments, some or all of the components included in the processing device 2500 may be attached to one or more motherboards. In some embodiments, some or all of these components are fabricated on a single SoC die or coupled to a single support structure, e.g., to a single carrier substrate.

Additionally, in various embodiments, the processing device 2500 may not include one or more of the components illustrated in FIG. 15, but the processing device 2500 may include interface circuitry for coupling to the one or more components. For example, the processing device 2500 may not include a memory 2504, but may include display device interface circuitry (e.g., a connector and driver circuitry) to which a memory 2504 may be coupled.

The processing device 2500 may include logic circuitry 2502 (e.g., one or more circuits configured to implement logic/compute functionality). Examples of such circuits include ICs implementing one or more of input/output (I/O) functions, arithmetic operations, pipelining of data, etc.

In some embodiments, the logic circuitry 2502 may include one or more circuits responsible for read/write operations with respect to the data stored in the memory 2504. To that end, the logic circuitry 2502 may include one or more I/O ICs configured to control access to data stored in the memory 2504.

In some embodiments, the logic circuitry 2502 may include one or more high-performance compute dies, configured to perform various operations with respect to data stored in the memory 2504 (e.g., arithmetic and logic operations, pipelining of data from one or more memory dies of the memory 2504, and possibly also data from external devices/chips). In some embodiments, the logic circuitry 2502 may be configured to only control I/O access to data but not perform any operations on the data. In some embodiments, the logic circuitry 2502 may implement ICs configured to implement I/O control of data stored in the memory 2504, assemble data from the memory 2504 for transport (e.g., transport over a central bus) to devices/chips that are either internal or external to the processing device 2500, etc. In some embodiments, the logic circuitry 2502 may not be configured to perform any operations on the data besides I/O and assembling for transport to the memory 2504.

The processing device 2500 may include a memory 2504, which may include one or more ICs configure to implement memory circuitry (e.g., ICs implementing one or more of memory devices, memory arrays, control logic configured to control the memory devices and arrays, etc.). In some embodiments, the memory 2504 may be implemented substantially as described above with reference to the memory 2404 (FIG. 14). In some embodiments, the memory 2504 may be a designated device configured to provide storage functionality for the components of the processing device 2500 (i.e., local), while the memory 2404 may be configured to provide system-level storage functionality for the entire computing device 2400 (i.e., global). In some embodiments, the memory 2504 may include memory that shares a die with the logic circuitry 2502.

In some embodiments, the memory 2504 may include a flat memory (also sometimes referred to as a "flat hierarchy memory" or a "linear memory") and, therefore, may also be referred to as a "basin memory." As known in the art, a flat memory or a linear memory refers to a memory addressing paradigm in which memory may appear to the program as a single contiguous address space, where a processor can directly and linearly address all of the available memory locations without having to resort to memory segmentation or paging schemes. Thus, the memory implemented in the memory 2504 may be a memory that is not divided into hierarchical layer or levels in terms of access of its data.

In some embodiments, the memory 2504 may include a hierarchical memory. In this context, hierarchical memory refers to the concept of computer architecture where computer storage is separated into a hierarchy based on features of memory such as response time, complexity, capacity, performance, and controlling technology. Designing for high performance may require considering the restrictions of the memory hierarchy, i.e., the size and capabilities of each component. With hierarchical memory, each of the various memory components can be viewed as part of a hierarchy of memories ($m_1$, $m_2$, . . . , $m_n$) in which each member $m_i$ is typically smaller and faster than the next highest member $m_{i+1}$ of the hierarchy. To limit waiting by higher levels, a lower level of a hierarchical memory structure may respond by filling a buffer and then signaling for activating the transfer. For example, in some embodiments, the hierarchical memory implemented in the memory 2504 may be separated into four major storage levels: 1) internal storage (e.g., processor registers and cache), 2) main memory (e.g., the system RAM and controller cards), and 3) on-line mass storage (e.g., secondary storage), and 4) off-line bulk storage (e.g., tertiary, and off-line storage). However, as the number of levels in the memory hierarchy and the performance at each level has increased over time and is likely to continue to increase in the future, this example hierarchical division provides only one non-limiting example of how the memory 2504 may be arranged.

The processing device 2500 may include a communication device 2506, which may be implemented substantially as described above with reference to the communication chip 2406 (FIG. 14). In some embodiments, the communication device 2506 may be a designated device configured to provide communication functionality for the components of the processing device 2500 (i.e., local), while the communication chip 2406 may be configured to provide system-level communication functionality for the entire computing device 2400 (i.e., global).

The processing device 2500 may include interconnects 2508, which may include any element or device that includes an electrically conductive material for providing electrical connectivity to one or more components of, or associated with, a processing device 2500 or/and between various such components. Examples of the interconnects 2508 include conductive lines/wires (also sometimes referred to as "lines" or "metal lines" or "trenches") and conductive vias (also sometimes referred to as "vias" or "metal vias"), metallization stacks, redistribution layers, metal-insulator-metal (MIM) structures, etc.

The processing device 2500 may include a temperature detection device 2510 which may be implemented substantially as described above with reference to the temperature detection device 2426 (FIG. 14) but configured to determine temperatures on a more local scale, i.e., of the processing device 2500 of components thereof. In some embodiments, the temperature detection device 2510 may be a designated device configured to provide temperature detection functionality for the components of the processing device 2500 (i.e., local), while the temperature detection device 2426 may be configured to provide system-level temperature detection functionality for the entire computing device 2400 (i.e., global).

The processing device 2500 may include a temperature regulation device 2512 which may be implemented substantially as described above with reference to the temperature regulation device 2428 (FIG. 14) but configured to regulate temperatures on a more local scale, i.e., of the processing device 2500 of components thereof. In some embodiments, the temperature regulation device 2512 may be a designated device configured to provide temperature regulation functionality for the components of the processing device 2500 (i.e., local), while the temperature regulation device 2428 may be configured to provide system-level temperature regulation functionality for the entire computing device 2400 (i.e., global).

The processing device 2500 may include a battery/power circuitry 2514 which may be implemented substantially as described above with reference to the battery/power circuitry 2410 (FIG. 14). In some embodiments, the battery/power circuitry 2514 may be a designated device configured to provide battery/power functionality for the components of the processing device 2500 (i.e., local), while the battery/power circuitry 2410 may be configured to provide system-level battery/power functionality for the entire computing device 2400 (i.e., global).

The processing device 2500 may include a hardware security device 2516 which may be implemented substantially as described above with reference to the security interface device 2424 (FIG. 14). In some embodiments, the hardware security device 2516 may be a physical computing device configured to safeguard and manage digital keys, perform encryption and decryption functions for digital signatures, authentication, and other cryptographic functions. In some embodiments, the hardware security device 2516 may include one or more secure cryptoprocessors chips.

Select Examples

Example 1 provides an IC device, including: a first region, including a first semiconductor material with a first type of dopant; a second region, including a second semiconductor material with the first type of dopant; a third region, including a third semiconductor material with a second type of dopant, the second type different from the first type; a channel region, including a fourth semiconductor material; a first gate over a portion of the channel region that is between the first region and the second region; and a second gate over a portion of the channel region that is between the first region and the third region.

Example 2 provides the IC device according to example 1, where: the first gate includes a gate electrode, a first gate insulator, and a second gate insulator, the first gate insulator is between the gate electrode and the first region or the second region, and the second gate insulator is between the gate electrode and the channel region.

Example 3 provides the IC device according to example 1 or 2, where: the second gate includes a gate electrode, a first gate insulator, and a second gate insulator, the first gate insulator is between the gate electrode and the first region or the third region, and the second gate insulator is between the gate electrode and the channel region.

Example 4 provides the IC device according to any of the preceding examples, where an insulator is between a gate electrode of the first gate and a gate electrode of the second gate.

Example 5 provides the IC device according to any of the preceding examples, where the first gate is electrically coupled to the second gate.

Example 6 provides the IC device according to any of the preceding examples, further including a substrate, where the first region or the second region is at a first side of the substrate, the third region is at a second side of the substrate, and the first side opposes the second side.

Example 7 provides the IC device according to example 6, where the first gate or the second gate is at the second side of the substrate.

Example 8 provides the IC device according to example 6 or 7, where a portion of the channel region is in the substrate.

Example 9 provides the IC device according to example 8, where a first portion of the channel region is at the first side of the substrate, and a second portion of the channel region is at the second side of the substrate.

Example 10 provides the IC device according to any of the preceding examples, where the first type of dopant is an n-type dopant, and the second type of dopant is a p-type dopant.

Example 11 provides a method for forming an IC device, including: forming a channel region, the channel region including a semiconductor material; forming a first region at a first section of the channel region, the first region including a first semiconductor material doped with a first type of dopant; forming a second region at a second section of the second structure, the second region including a second semiconductor material doped with the first type of dopant; forming a third region at a third section of the second structure, the third region including a fourth semiconductor material doped with a second type of dopant, the second type different from the first type; forming a first gate over a fourth section of the channel region, the first gate including a first gate electrode; and forming a second gate over a fifth section of the channel region, the second gate including a second gate electrode, where the fourth section is between the first section and the second section, and the fifth section is between the first section and the third section.

Example 12 provides the method according to example 11, where the first gate further includes a first gate insulator that separates the gate electrode from the first region or the second region, and the second gate further includes a second gate insulator that separates the gate electrode from the first region or the third region.

Example 13 provides the method according to example 11 or 12, where the first gate further includes a first gate insulator, the second gate further includes a second gate insulator, the first gate insulator is between the fourth section and the first gate electrode, the second gate insulator is between the fifth section and the second gate electrode.

Example 14 provides the method according to any one of examples 11-13, where forming the first region at the first section of the channel region includes: forming the first region over a substrate to form a combined structure; bonding at least a portion of the combined structure to the first section of the second structure; and removing the substrate.

Example 15 provides the method according to any one of examples 11-14, where the first semiconductor material is the same as the second semiconductor material.

Example 16 provides an IC device, including: a substrate; a first transistor arrangement, including: a first region, including a first semiconductor material with dopants of a first type, a second region, including a second semiconductor material with dopants of the first type, and a channel region, the channel region crossing the substrate; a second transistor arrangement, including: the first region, the channel region, and a third region, including a third semiconductor material with dopants of a second type, where the second type is different from the first type, where the first region, the second region, and the third region are connected to the channel region.

Example 17 provides the IC device according to example 16, further including: a first gate electrode over a first portion of the channel region, where the first portion of the channel region is between the first region and the second region; and a second gate electrode over a second portion of the channel region, where the second portion of the channel region is between the first region and the third region.

Example 18 provides the IC device according to example 17, where the first gate electrode wraps around the first portion of the channel region, or the second gate electrode wraps around the second portion of the channel region Example 19 provides the IC device according to example 17, further including: a first insulator between the first gate electrode and the first region or the second region; and a second insulator between the second gate electrode and the first region or the third region.

Example 20 provides the IC device according to example 17, further including: a first insulator between the first gate electrode and the first portion of the channel region; and a second insulator between the second gate electrode and the second portion of the channel region.

Example 21 provides an IC package, including the IC device according to any one of examples 1-10 and 16-20; and a further IC component, coupled to the IC device.

Example 22 provides the IC package according to example 21, where the further IC component includes one of a package substrate, an interposer, or a further IC die.

Example 23 provides the IC package according to example 21 or 22, where the IC device according to any one of examples 1-10 and 16-20 may include, or be a part of, at least one of a memory device, a computing device, a wearable device, a handheld electronic device, and a wireless communications device.

Example 24 provides an electronic device, including a carrier substrate; and one or more of the IC devices according to any one of examples 1-10 and 16-20 and the IC package according to any one of examples 21-23, coupled to the carrier substrate.

Example 25 provides the electronic device according to example 24, where the carrier substrate is a motherboard.

Example 26 provides the electronic device according to example 24, where the carrier substrate is a PCB.

Example 27 provides the electronic device according to any one of examples 24-26, where the electronic device is a wearable electronic device or handheld electronic device.

Example 28 provides the electronic device according to any one of examples 24-27, where the electronic device further includes one or more communication chips and an antenna.

Example 29 provides the electronic device according to any one of examples 24-28, where the electronic device is an RF transceiver.

Example 30 provides the electronic device according to any one of examples 24-28, where the electronic device is one of a switch, a power amplifier, a low-noise amplifier, a filter, a filter bank, a duplexer, an upconverter, or a downconverter of an RF communications device, e.g., of an RF transceiver.

Example 31 provides the electronic device according to any one of examples 24-30, where the electronic device is a computing device.

Example 32 provides the electronic device according to any one of examples 24-31, where the electronic device is included in a base station of a wireless communication system.

Example 33 provides the electronic device according to any one of examples 24-31, where the electronic device is included in a user equipment device of a wireless communication system.

Example 34 provides the method according to any one of examples 11-15, further including processes for forming the IC device according to any one of examples 1-10 and 16-20.

Example 35 provides the method according to any one of examples 11-15, further including processes for forming the IC package according to any one of examples 21-23.

Example 36 provides the method according to any one of examples 11-15, further including processes for forming the electronic device according to any one of examples 24-31.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a first region, comprising a first semiconductor material with dopants of a first type;
a second region, comprising a second semiconductor material with dopants of the first type;
a third region, comprising a third semiconductor material with dopants of a second type, wherein the second type is different from the first type;
a channel region, comprising a fourth semiconductor material;
a first gate over a first portion of the channel region, wherein the first portion of the channel region is between the first region and the second region; and
a second gate over a second portion of the channel region, wherein the second portion of the channel region is between the first region and the third region,
wherein the first gate is electrically coupled to the second gate.

2. The IC device according to claim 1, wherein:
the first gate comprises a gate electrode, a first gate insulator, and a second gate insulator,
the first gate insulator is between the gate electrode and either the first region or the second region, and
the second gate insulator is between the gate electrode and the channel region.

3. The IC device according to claim 1, wherein:
the second gate comprises a gate electrode, a first gate insulator, and a second gate insulator,
the first gate insulator is between the gate electrode and the first region or the third region, and
the second gate insulator is between the gate electrode and the channel region.

4. The IC device according to claim 1, wherein an insulator is between a gate electrode of the first gate and a gate electrode of the second gate.

5. The IC device according to claim 1, further comprising a substrate, wherein the first region or the second region is at a first side of the substrate, the third region is at a second side of the substrate, and the first side opposes the second side.

6. The IC device according to claim 5, wherein the first gate or the second gate is at the second side of the substrate.

7. The IC device according to claim 5, wherein a portion of the channel region is in the substrate.

8. The IC device according to claim 7, wherein a first portion of the channel region is at the first side of the substrate, and a second portion of the channel region is at the second side of the substrate.

9. The IC device according to claim 1, wherein the first type is an n-type and the second type is a p-type.

10. A method for forming an integrated circuit (IC) device, the method comprising:
providing a channel region, the channel region comprising a semiconductor material;
providing a first region at a first section of the channel region, the first region comprising a first semiconductor material with dopants of a first type;
providing a second region at a second section of the channel region, the second region comprising a second semiconductor material with dopants of the first type;
providing a third region at a third section of the channel region, the third region comprising a fourth semiconductor material with dopants of a second type, wherein the second type is different from the first type;

providing a first gate over a fourth section of the channel region, the first gate comprising a first gate electrode; and providing a second gate over a fifth section of the channel region, the second gate comprising a second gate electrode, wherein the first gate is electrically coupled to the second gate, the fourth section is between the first section and the second section, and the fifth section is between the first section and the third section.

11. The method according to claim 10, wherein the first gate further comprises a first gate insulator that is between the first gate electrode and the first region or the second region, and the second gate further comprises a second gate insulator that is between the second gate electrode from the first region or the third region.

12. The method according to claim 10, wherein the first gate further comprises a first gate insulator, the second gate further comprises a second gate insulator, the first gate insulator is between the fourth section and the first gate electrode, the second gate insulator is between the fifth section and the second gate electrode.

13. The method according to claim 10, wherein providing the first region at the first section of the channel region comprises:

providing the first region over a substrate to form a combined structure;

bonding at least a portion of the combined structure to the first section of the channel region; and removing the substrate.

14. The method according to claim 10, wherein the first semiconductor material is the same as the second semiconductor material.

15. An integrated circuit (IC) device, comprising:
a substrate;
a first transistor arrangement, comprising:
a first region, comprising a first semiconductor material with dopants of a first type,
a second region, comprising a second semiconductor material with dopants of the first type, and
a channel region, the channel region crossing the substrate; and
a second transistor arrangement, comprising:
the first region,
the channel region, and
a third region, comprising a third semiconductor material with dopants of a second type, wherein the second type is different from the first type,
wherein the first region, the second region, and the third region are connected to the channel region.

16. The IC device according to claim 15, further comprising:
a first gate electrode over a first portion of the channel region, wherein the first portion of the channel region is between the first region and the second region; and
a second gate electrode over a second portion of the channel region, wherein the second portion of the channel region is between the first region and the third region.

17. The IC device according to claim 16, wherein the first gate electrode wraps around the first portion of the channel region, or the second gate electrode wraps around the second portion of the channel region.

18. The IC device according to claim 16, further comprising:
a first insulator between the first gate electrode and the first region or the second region; and
a second insulator between the second gate electrode and the first region or the third region.

19. The IC device according to claim 16, further comprising:
a first insulator between the first gate electrode and the first portion of the channel region; and
a second insulator between the second gate electrode and the second portion of the channel region.

* * * * *